United States Patent [19]
Nishiuma et al.

[11] Patent Number: 5,616,520
[45] Date of Patent: Apr. 1, 1997

[54] SEMICONDUCTOR INTEGRATED CIRCUIT DEVICE AND FABRICATION METHOD THEREOF

[75] Inventors: Masahiko Nishiuma, Ohme; Norio Nakazato, Chiba; Hiroyuki Takahashi, Tachikawa; Chiyoshi Kamada, Kokubunji; Motoo Suwa, Koganei, all of Japan

[73] Assignees: Hitachi, Ltd., Chiyoda-Ku; Hitachi VLSI Engineering Corp., Kodaira, both of Japan

[21] Appl. No.: 367,490

[22] Filed: Dec. 30, 1994

Related U.S. Application Data

[63] Continuation-in-part of Ser. No. 226,597, Apr. 12, 1994, abandoned, which is a continuation-in-part of Ser. No. 36,577, Mar. 24, 1993, abandoned.

[30] Foreign Application Priority Data

Mar. 30, 1992 [JP] Japan ..................................... 4-71767
May 19, 1993 [JP] Japan ..................................... 5-116266

[51] Int. Cl.$^6$ .................................................. H01L 21/60
[52] U.S. Cl. ........................ 438/125; 228/180.22; 29/840; 438/126
[58] Field of Search ................................... 437/209, 211, 437/212, 214, 215, 217, 182, 183

[56] References Cited

U.S. PATENT DOCUMENTS

| | | | |
|---|---|---|---|
| 4,372,037 | 2/1983 | Scapple et al. | |
| 4,604,644 | 8/1986 | Beckham et al. | 437/211 |
| 4,874,721 | 10/1989 | Kimura et al. | 437/209 |
| 4,874,722 | 10/1989 | Bednarz et al. | 437/209 |
| 4,957,882 | 9/1990 | Shinomiya | 437/209 |
| 5,071,787 | 12/1991 | Mori et al. | 437/183 |
| 5,126,818 | 6/1992 | Takami et al. | 437/183 |
| 5,172,851 | 12/1992 | Matsuhita et al. | |
| 5,186,381 | 2/1993 | Kim | |
| 5,201,451 | 4/1993 | Desai et al. | 228/5.5 |
| 5,219,794 | 6/1993 | Satoh et al. | 437/209 |
| 5,249,450 | 10/1993 | Wood et al. | |

FOREIGN PATENT DOCUMENTS 283542 12/1991 Japan.
144872 6/1993 Japan.

*Primary Examiner*—Kevin Picardat
*Attorney, Agent, or Firm*—Pennie & Edmonds

[57] ABSTRACT

A semiconductor device is fabricated by forming first metal balls on electrode pads of a semiconductor chip. The first metal balls each can have a sharp tipped anchor. All of the anchors simultaneously flattened slightly only to the extent of equalizing the height thereof. The first metal balls are bonded to electrodes formed on a substrate with wirings by embedding the anchors into the electrodes. Alternatively, second metal balls can be formed on the electrodes which are then flattened to equalize the height thereof. The first metal balls, either with or without the anchors, are bonded to the second metal balls. The first and second metal balls are preferably heated during the bonding step to soften the second metal balls.

21 Claims, 35 Drawing Sheets

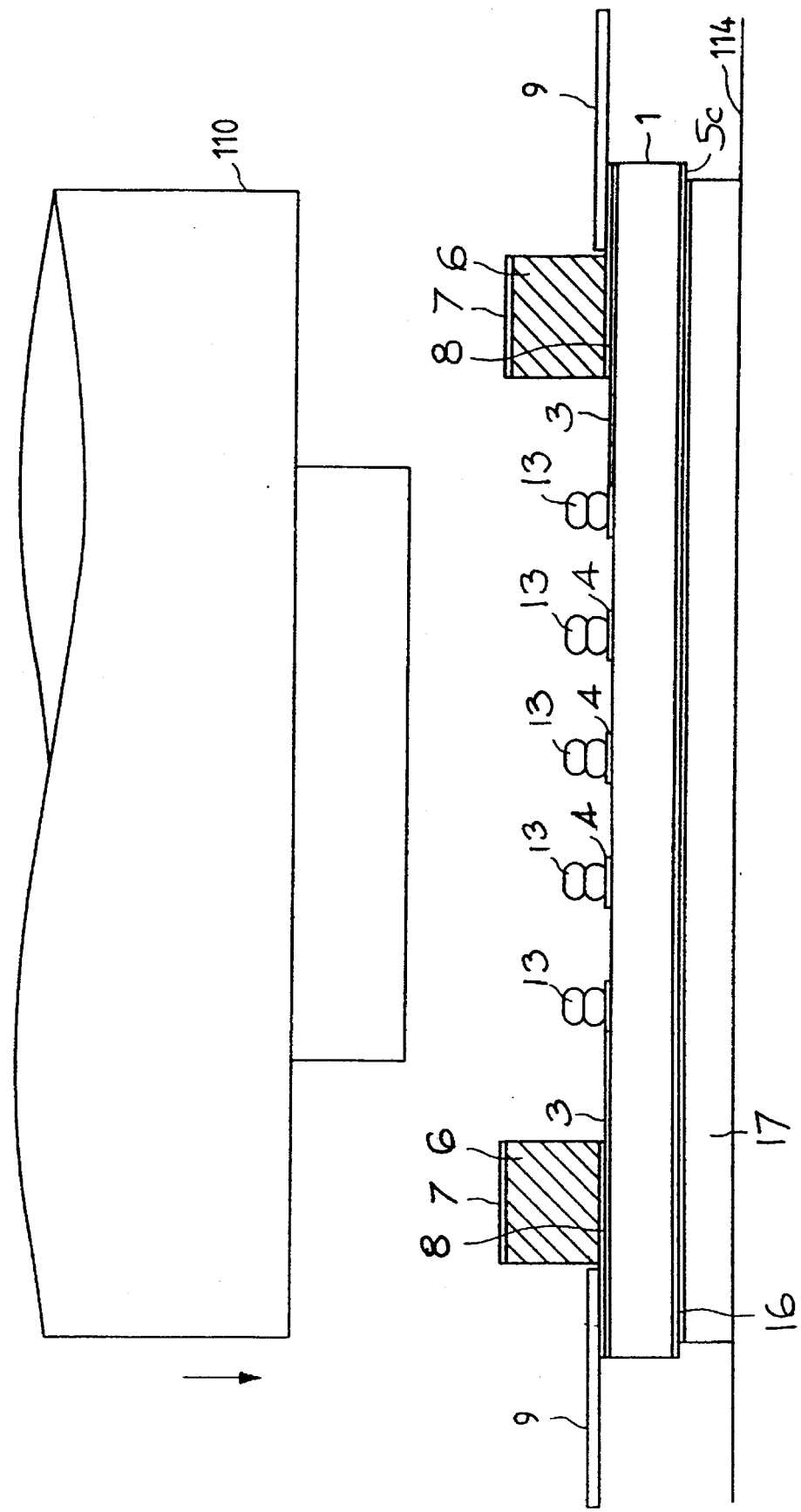

SEMICONDUCTOR INTEGRATED CIRCUIT DEVICE AND FABRICATION METHOD THEREOF

This is continuation-in-part of Ser. No. 08/226,597, filed Apr. 12, 1994, now abandoned, which is a continuation-in-part of Ser. No. 08/036,577, filed May 24, 1993, now abandoned.

BACKGROUND

The present invention relates to a semiconductor integrated circuit device fabrication technique and a semiconductor integrated circuit device obtained by the technique, and particularly to a technique for connecting a semiconductor chip to a printed wiring board by face down bonding of a semiconductor chip to a wiring substrate using metallic bumps.

The flip chip method has been known as an electrode connection technique for a semiconductor chip having many input/output terminals such as a gate array or a microcomputer. A known typical flip chip method is the CCB (Controlled Collapse Bonding) method for forming spherical bump electrode (CCB bump) made of solder on the electrode pads of a semiconductor chip to connect the semiconductor chip to a printed wiring board by using CCB bumps. The CCB method allows electrodes to be formed not only at the marginal part of a semiconductor chip, but also at the central portion thereof, producing a semiconductor device having multi-pin formation with decrease in the wiring lengths of the semiconductor device in comparison to the wire bonding method. A semiconductor device formed using the CCB method therefore provides a faster operating speed due to the shorter wiring length.

The CCB bumps are typically formed on the electrode pads of a semiconductor chip by a solder vacuum or evaporation deposition technique. To form the CCB bumps by using this technique, metal thin film layers (BLM: Ball Limiting Metallization) of Cr, Cr/Cu, Cu and Au or the like are vacuum-deposited on the semiconductor electrode pads. The solder has tendency to diffuse during the CCB bump formation due to the thermal hysteresis. The BLM layers prevent the solder from diffusing during the CCB bump formation. Then, a thin film layer of solder (Sn/Pb alloy) is deposited over the semiconductor chip surface, including over the BLM layers. The solder film layer is removed in areas other than the above portion of the BLM layer using a lifted off technique. When the solder thin film left on the BLM layers is melted, the surface tension creates a ball-shaped CCB bump on the electrode pad. The semiconductor chip and the wiring substrate are electrically connected through the CCB bumps by aligning the semiconductor chip over the electrode pads or the wiring lands on the wiring substrate and then remelting (reflow). Then, the semiconductor chip connected to the printed wiring board is hermetically sealed by a cap or the like.

The CCB bump forming technique is described in detail, for example, in the Journal of the Institute of Metal Engineers of Japan, Vol. 23, No. 12 (1984), pp. 1004–1013 and Data for Symposium of the Institute of Electrical Engineers of Japan, published on Mar. 17, 1989, p. 45–47. Also regarding an LSI package where a semiconductor chip mounted on a wiring substrate by the CCB system is hermetically sealed by a cap, description is found, for example, in JPA No. 249429/1987 or JPA No. 310139/1988.

Techniques have been recently studied to connect a GaAs chip having a high-speed IC operated on radio frequencies of 10 GHz or higher to a printed wiring board by using a flip chip method. However, in the CCB method for connecting a semiconductor chip to a printed wiring board by heating and reflowing CCB bumps, it is necessary to form internal layer wirings on the printed wiring board, taking the solder flow and the CCB bump shape control in consideration. A problem has been found in that transmission loss of high-frequency signals is produced due to the through-holes necessary to form internal layer wirings. In order to overcome this problem, a ceramic thick film board on which wiring and wiring lands are formed by a printing method is used. However, another problem arises in using the ceramic film board in that the reliability of connection between CCB bumps and wiring lands is low because the ceramic thick film board has large positional deviation of the wiring lands due to the misregistration and bleeding during printing and the shrinkage tolerance of ceramic during baking.

Moreover, the ceramic film board with the CCB bumps poses many disadvantages in that 1) it has a low reliability of connection between CCB bumps and wiring lands because the board largely warps and waves relative to a semiconductor chip; 2) the wiring lands further have variations in film thickness and thus uneven heights; 3) it is difficult to conduct the heat generated by a semiconductor chip to the printed wiring board through CCB bumps because solder which is the material of the CCB bumps has a large thermal resistance; 4) a CCB bump has a short service life because it is made of solder (Pb—Sn alloy) which easily causes thermal fatigue failure; and 5) the fabrication cost is high because an expensive vacuum deposition equipment and a complex lift-off process are necessary to form the CCB bumps and BLM layers.

SUMMARY OF THE INVENTION

Accordingly, the present inventors have developed new mounting technique which eliminates the above noted disadvantages of the above-mentioned CCB technique. It is an object of the present invention to provide a technique for decreasing the transmission loss of high-frequency signal due to the wiring structure of a printed wiring board or substrate in a semiconductor integrated circuit device in which a semiconductor chip is connected to the printed wiring substrate by using metallic bumps. It is another object of the present invention to provide a technique for improving the reliability of connection between a semiconductor chip and a printed wiring substrate in a semiconductor integrated circuit device in which a semiconductor chip is connected to the printed circuit substrate by using metallic bumps. It is still another object of the present invention to provide a technique for decreasing the thermal resistance of a semiconductor chip in a semiconductor integrated circuit device in which a semiconductor chip is connected to the printed wiring substrate by using metallic bumps. It is still another object of the present invention to provide a technique for decreasing the metallic bump fabrication cost in a semiconductor integrated circuit device in which a semiconductor chip is connected to the printed wiring substrate by using metallic bumps.

Specifically, according to the present invention a metal ball formed of metal other than Pb such as Au is formed using a ball bonding method onto an electrode pad of a wiring substrate and onto an electrode pad of a semiconductor chip respectively. The metal balls can be bonded to the electrode pads of a semiconductor chip and the wiring substrate by a ball bonding method using heat or ultrasonic energy, or both or a thermo-compression bonding. The heights of the metal balls formed on the wiring substrate side are equalized, preferably simultaneously flattening them using a flat surface, to form metal lands of uniform height. Subsequently, the metal lands at the wiring substrate side and the metal balls at the semiconductor chip side are overlaid over each other and joined by a thermo-compression bonding. As the metal balls are bonded to the wiring lands by a ball bonding method, it is possible to accurately align the metal balls with the metal balls formed on the semiconductor chip side.

A hermetically sealing cap can be included, preferably with a heat conductive material such as gold ribbons, gold wires, gold bumps to bonded to the cap by a ribbon or wire bonding method using heat or ultrasonic energy, or both, or thermo-compression bonding method. The heat conductive material is bonded to a inner wall of a quadrilateral sealing cap, for instance, by a thermo-compression bonding method. The cap is encased over the semiconductor chip so that the heat conductive material contacts the main surface of the semiconductor chip to transfer heat away from the chip through the heat conductive material and the cap.

When the metal lands at the wiring substrate side and the metal balls at the semiconductor chip side are not properly centered or the vertical direction of the load applied is shifted slightly with respect to the main surface of the wiring substrate, the metal ball at the semiconductor chip side can slip in the lateral direction, resulting in a misalignment and possible joint failure. Even if the metal ball at the wiring substrate side and the metal ball at the semiconductor chip side are overlaid correctly, the phase deviation can occur while transporting the same to the thermo compression bonding apparatus.

In order to overcome this alignment problem, according to another aspect of the present invention, the metal balls formed on the electrode pad of the semiconductor chip are each provided with an anchor having a sharpened tip. A set of metal balls are then formed on the wiring substrate which are then flattened as described above to form metal lands. Then, the metal balls and the metal lands are heated to soften them and then the metal balls are aligned and laid over the metal lands and simultaneously subject to embedding the anchors formed on the metal balls to the metal lands during the thermo-compression bonding. Preferably, the metal balls are heated and softened at a temperature lower than the recrystallization temperature of the metal composition to maintain their respective shape, while the metal lands are heated and softened at a temperature higher than the recrystallization temperature of the metal to allow the metal lands to deform or accommodate the anchors. The anchors of the metal balls can also be slightly flattened to equalize the height of the metal balls.

Further, according to another aspect of the present invention, instead of forming metal lands, electrodes and wirings connecting the electrodes, each comprising a plurality of layers of conductive film, can be formed on the wiring substrate. The metal balls with anchors are embedded in the electrodes by thermo-compression bonding. Since the anchors bite into the metal lands or the electrodes of the wiring substrate, they enable secure connection without slippage.

According to the present invention, since the metal lands or electrodes of the wiring substrate become softer than the metal balls of the semiconductor chip, the anchors of the metal balls can be securely embedded into the metal lands or electrodes with a small load.

According to the present invention, since the height of all metal lands of the wiring substrate and all metal balls of the semiconductor chip are equalized, uniform load can be applied to all metal lands or electrodes and all metal balls during the thermo compression bonding.

According to the present invention, since the tips of the metal balls of the semiconductor chip are completely in parallel to the upper surface of the metal lands of the wiring substrate, uniform load can be applied to all metal lands or electrodes and all metal balls during the thermo compression bonding.

According to the present invention, since solder, which is prone to thermal fatigue, is not used, reliability of the connection part between the semiconductor chip and the wiring substrate is improved. The stress produced due to the differences in thermal expansion coefficient between the printed wiring substrate, cap, and semiconductor chip are absorbed by the deformation of the heat conductive material, it is possible to decrease the stress put on the metal balls and metal lands.

According to the present invention, since the metal balls are formed using the wire bonding apparatus existing already, the expensive evaporation facilities and the troublesome lift off process required in the conventional CCB technique become unnecessary, thus reducing the manufacturing cost.

According to the present invention, it is unnecessary to form inner layer wirings which require careful formation to prevent any solder flow problem and the control of the CCB bump shape since the wiring lands of the printed circuit substrate are bonded to metallic balls of a semiconductor chip by thermo-compression bonding.

According to the present invention, it is possible to provide the input/output signal paths of the printed circuit substrate only by forming surface wirings and to decrease the transmission loss. Moreover, the characteristic impedances ($z_0$) of the surface wiring can be easily adjusted by using surface wiring trimming formed using a laser or the like. Furthermore, because the semiconductor device components, including the capacitors can be mounted on the surface of the printed wiring substrate, the terminating resistors of surface wirings can be easily adjusted.

BRIEF DESCRIPTION OF THE DRAWINGS

These and other features, aspects, and advantages of the present invention will become much more apparent from the following description, appended claims, and accompanying drawings where:

FIG. 25 is a schematic diagram showing a process of flattening metal balls according to the present invention.

DESCRIPTION OF THE DRAWINGS

Figure 1:
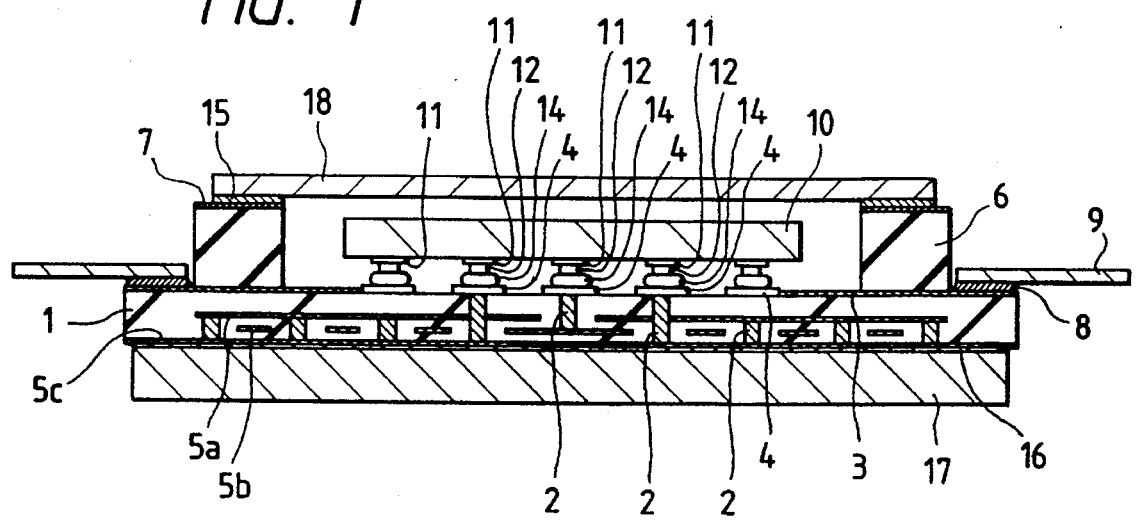
FIG. 1 shows a sectional view of a semiconductor integrated circuit device according to one aspect of the present invention.

The present invention, as shown in the drawings, shows different embodiments. For convenience, the same or equivalent elements of the invention of embodiments illustrated in the drawings have been identified with the same reference numerals.

Referring to FIG. 1, the semiconductor integrated circuit device of this embodiment has a package structure fabricated by sealing a semiconductor chip 10 mounted on a wiring substrate 1 with a cap 18. The semiconductor chip 10 is made of a compound semiconductor such as GaAs, on whose element forming surface a semiconductor integrated circuit operated on a radio frequency above 10 GHz and a plurality of electrode pads are formed.

The printed wiring board 1 is made of ceramic such as alumina or aluminum nitride, on whose surface a plurality of surface wires 3 and a plurality of wiring 1 and electrodes 4 are formed and in which the GND wiring 5a and the power source wiring 5b are formed. The surface wiring 3, wiring lands 4, GND wiring 5a, and power source wiring 5b are made of thick films of a refractory metal such as W formed by a screen printing method. The surfaces of the surface wiring 3 and wiring lands 4 are plated with Ni and Au in the order from the bottom.

The surface wirings 3 are wirings for input/output signals, GND, and power source, one end of each of wirings is connected to one of the wiring lands 4. The wiring for GND is electrically connected to the GND wiring 5a through a through-hole 2 and the wiring for power source is electrically connected to the power source wiring 5b through the through-holes 2. Leads 9 constituting external terminals of the package are formed on the marginal part of the printed wiring board 1. The leads 9 are made of a metal such as 42-alloy or copper and bonded to the surface wiring 3 through a lead brazing material 8.

A GND metallize 5c electrically connected to the GND wiring 5a through a through-hole 2 is formed at the entire back of the printed wiring board 1. The GND metallize 5c is of a thick film of a refractory metal such as W plated with Ni and Au. A metallic base 17 having almost the same external dimensions as those of the printed wiring board 1 is bonded to the GND metallize 5c through a brazing filler metal 16 for bonding the metallic base. The metallic base 17 is made of, for example, W/Cu alloy containing 10% Cu, which is for the stabilization of the GND potential and reinforcement of the package and the heatsink.

Au lands 14 whose surfaces are flattened by a method which will be mentioned later are bonded to the wiring electrodes or lands 4 formed on the printed wiring board 1. Au balls 12 having a diameter smaller than that of the Au lands 14 are bonded to the electrode pads 11 on the element forming surface of the semiconductor chip 10. The wiring lands 4 of the printed wiring board 1 is electrically connected to the electrode pads 11 of the semiconductor chip 10 by bonding the Au lands 14 to the Au balls 12 by a thermo-compression bonding which will be mentioned later.

A square dam frame 6 for sealing is formed around the semiconductor chip 10 on the wiring board 1. The dam frame 6 is made of ceramic such as alumina or aluminum nitride. The cap 18 is bonded to the surface of the frame 6 through a sealing metallize 7 and brazing filler metal 15 for sealing. The sealing dam frame 6 forms a cavity in which the semiconductor chip 10 is mounted.

The sealing metallize 7 is of a thick film of a refractory metal such as W plated with, for example, Ni and Au and the brazing filler metal 15 for sealing is made of, for example, Au—Sn alloy containing approx. 20% Sn or hard solder. The cap 18 is of a metallic plate of, for example, 42-alloy plated with Au.

The following is the description of the fabrication method of the semiconductor integrated circuit device having the above constitution in the order of the steps by referring to FIGS. 2 to 8.

Figure 2:
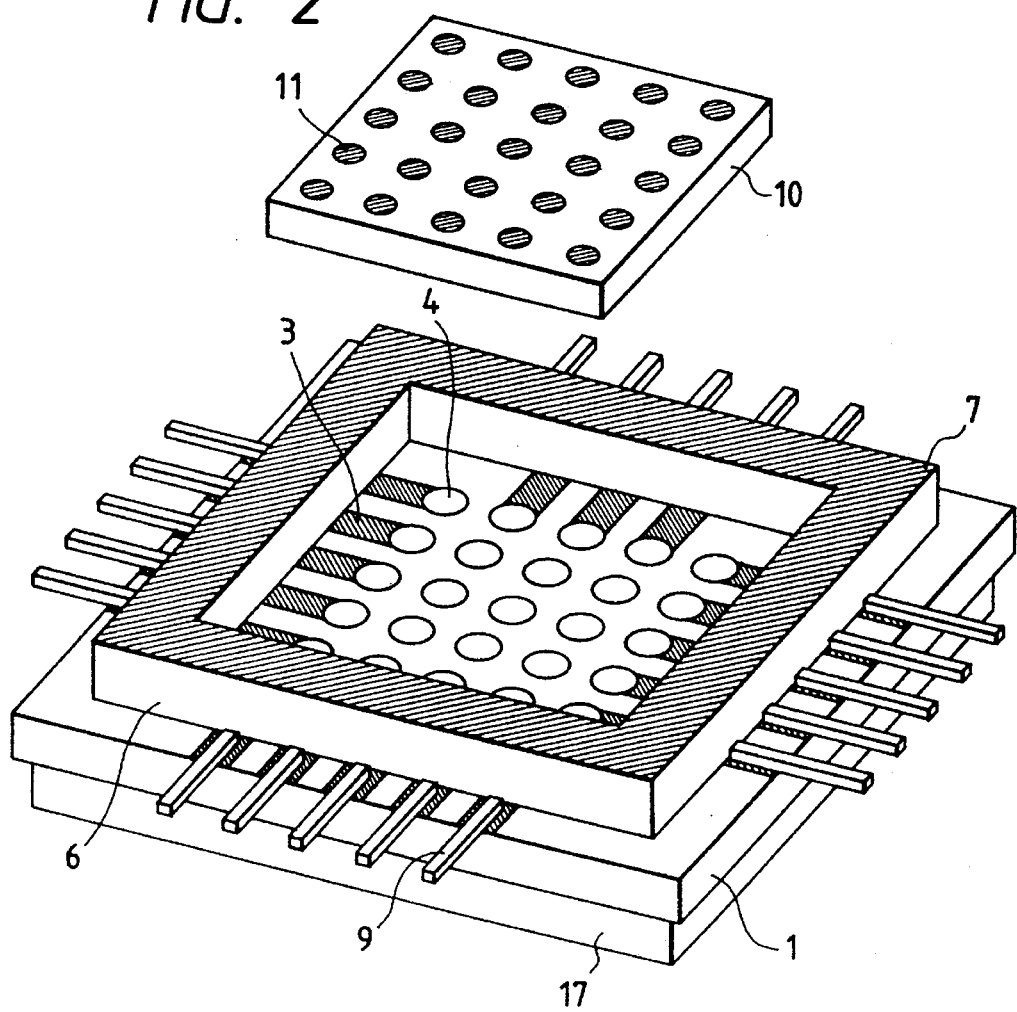
FIG. 2 shows a perspective view of a semiconductor chip and a printed wiring substrate for illustrating a fabrication method of the semiconductor integrated circuit device according to the present invention.

First, a printed wiring board 1 and a semiconductor chip 10 as shown in FIG. 2 are prepared. The surface wiring 3 and wiring land 4 of thick films of a refractory metal such as W plated with Ni and Au are formed on the surface of the printed wiring board 1 by a known screen printing method. The leads 9 are bonded to the surface wiring 3 on a peripheral area of the printed wiring board 1. The sealing dam frame 6 is formed around the chip mounting area on the printed wiring board 1. The sealing metallize 7 is formed on the surface of the sealing dam frame 6. The metallic base 17 is bonded to the back of the printed wiring board 1.

The semiconductor chip 10 is made of a compound semiconductor such as GaAs, on which a semiconductor integrated circuit operated on radio frequencies is formed. On the element forming surface of the chip 10, electrode pads 11 are formed by boring holes in the surface protection film. The electrode pads 11 are made of Au similarly to the integrated circuit wirings.

Figure 3:
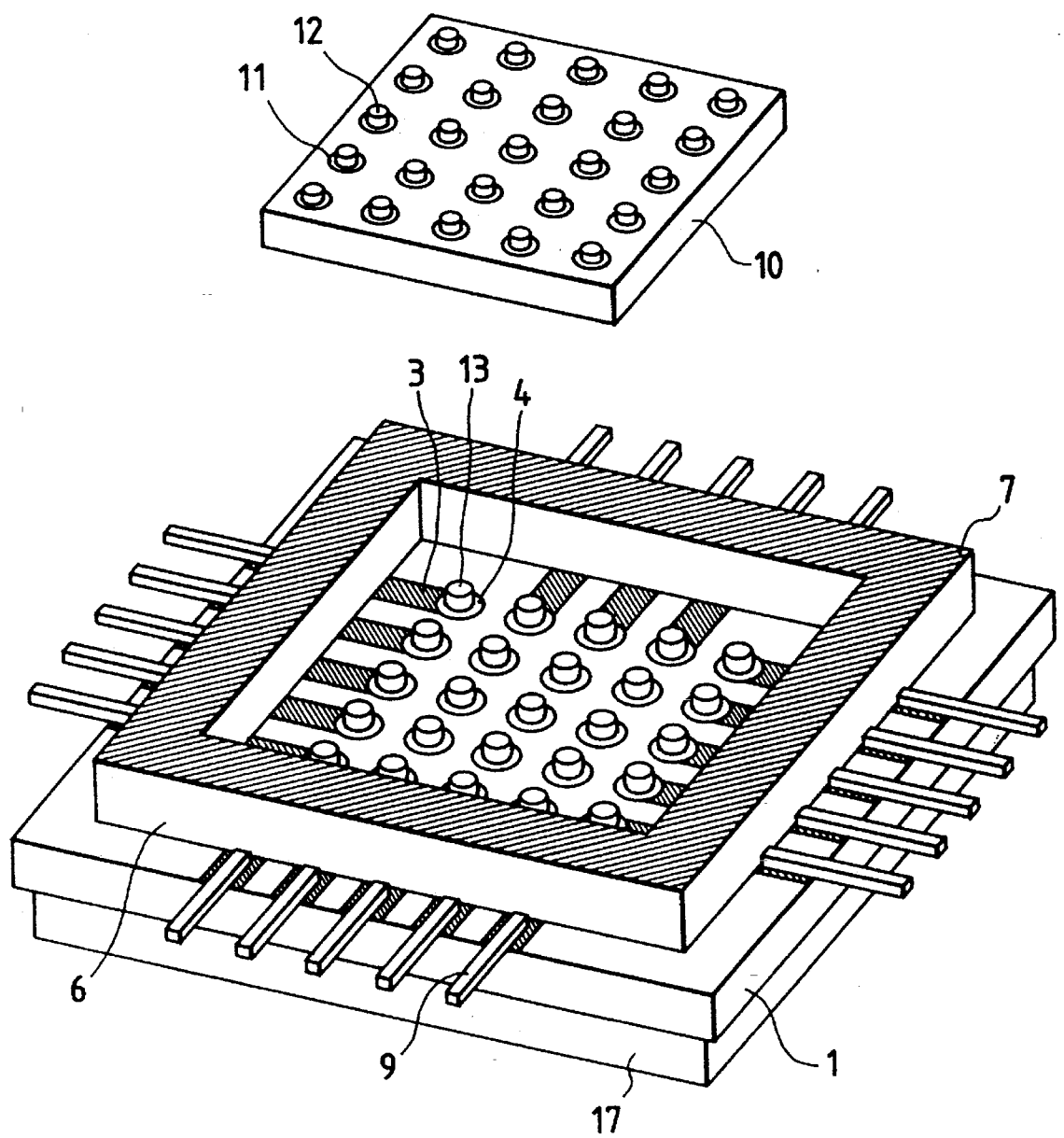
FIG. 3 shows another perspective view of a semiconductor chip and a printed wiring substrate for illustrating a fabrication method of the semiconductor integrated circuit device according to another aspect of the present invention.

Then, as shown in FIG. 3, Au balls 12 are bonded to the electrode pads 11 of the semiconductor chip 10 by a known ball-bonding method using heat or ultrasonic energy or both. The Au balls 12 have, for example, a diameter of approx. 120 μm and a height of approx. 80 μm. Thus, in this embodiment, the Au balls 12 are bonded to the electrode pads 11 of the semiconductor chip 10 by a ball-bonding method. Therefore, expensive vacuum-deposition equipment and complex lift-off process required to form CCB bumps and BLM layers are unnecessary according to the present invention.

Then, Au balls 13 are bonded to the wiring lands 4 of the printed wiring board 1 by the above ball-bonding method. The diameter and height of the Au balls 13 may be almost the same as those of the Au balls 12. The diameter and height of the Au balls 12 and 13 can be adjusted by changing the diameter of an Au wire used.

To bond the Au balls 13 to the wiring lands 4 of the printed wiring board 1, the coordinates are used which are made by mirror-inverting the bonding coordinates used to bond the Au balls 12 to the electrode pads 11 of the semiconductor chip 10.

By using the above coordinates, it is possible to align the central position of each Au ball 13 with that of the corresponding Au bump 12 at a high accuracy even if the positions of the wiring lands 4 are shifted from the designed coordinates due to the misregistration and bleeding in printing and the shrinkage tolerance of ceramic during baking.

Figure 4:
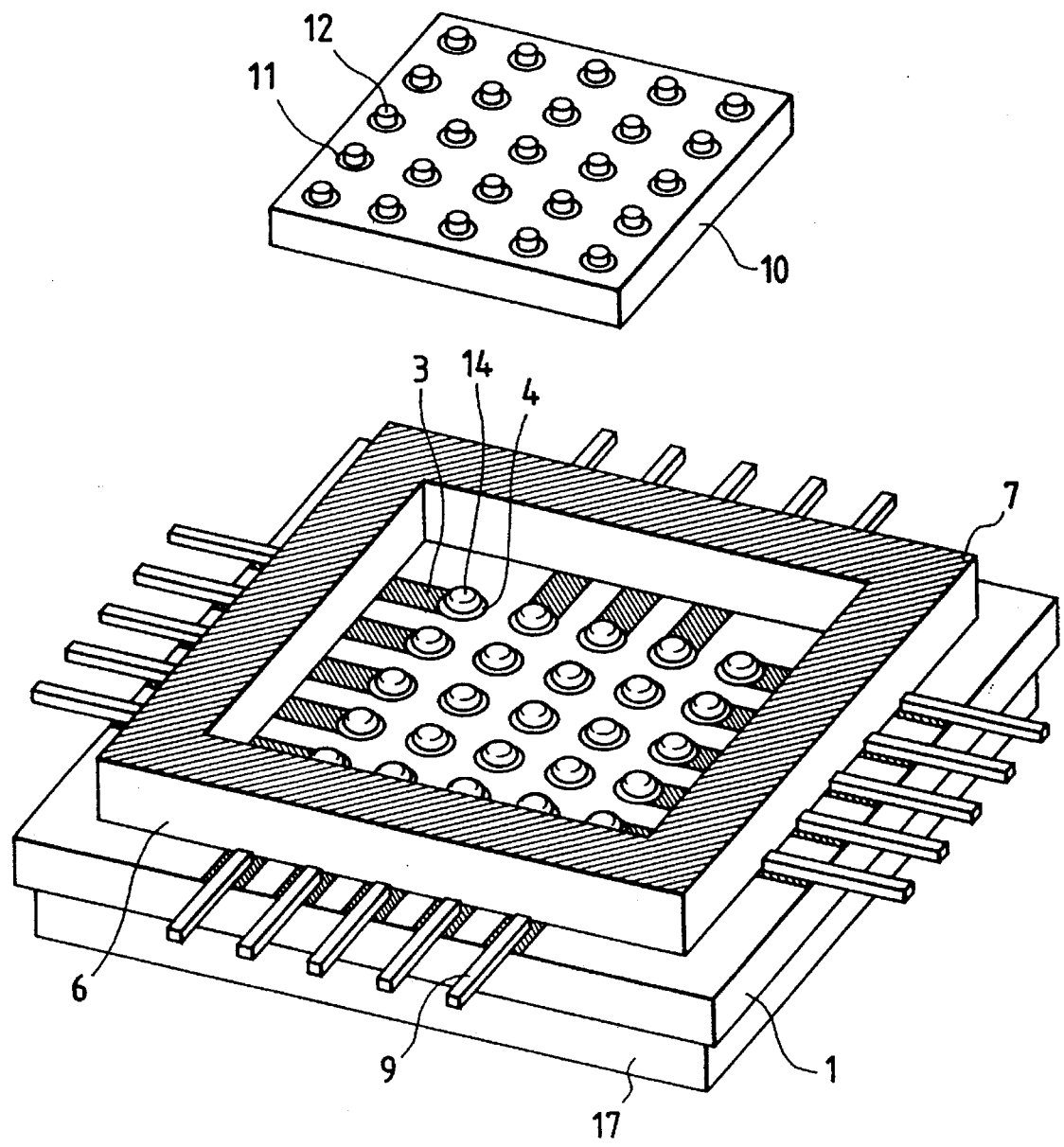
FIG. 4 shows a perspective view similar to FIG. 3, but showing the flattened metal lands.

Then, as shown in FIG. 4, the Au lands 14 are formed by pressing and flattening the Au balls 13 bonded to the wiring lands 4 of the printed wiring board 1. For example, Au lands 14 having a diameter of approx. 180 μm and a height of approx. 40 μm can be formed by pressing and flattening the Au balls 13 having a diameter of approx. 120 μm and a height of approx. 80 μm by applying a pressure of approx. 100 gf per ball.

Figure 5A:
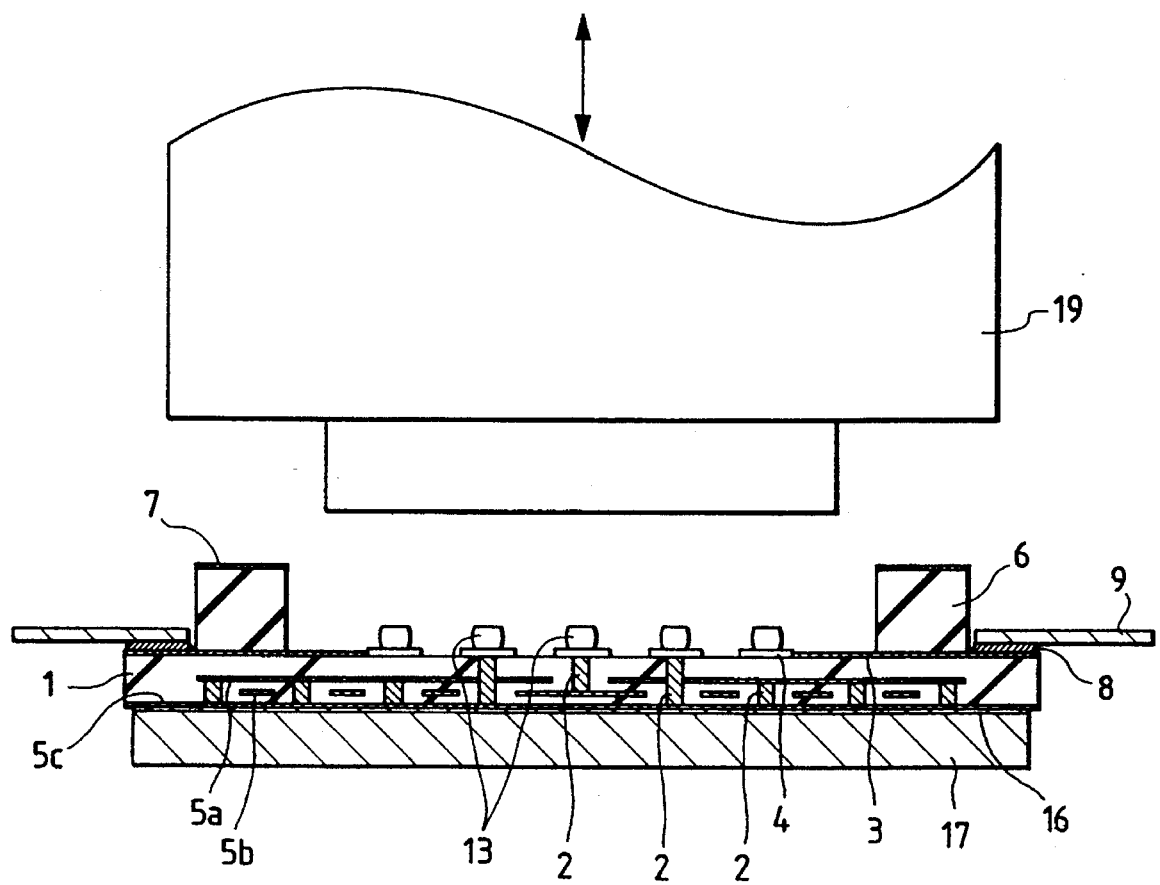
FIG. 5(a) shows a sectional view of a printed wiring substrate for illustrating a fabrication method of the semiconductor integrated circuit device according to the present invention.
Figure 5B:
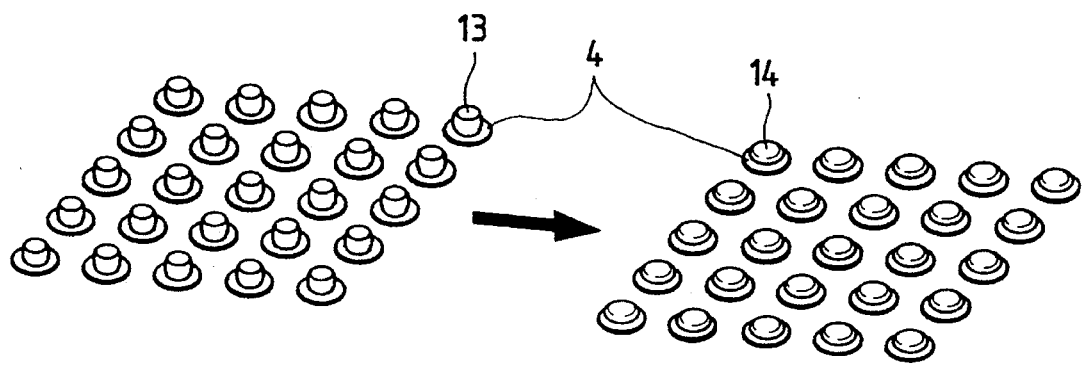
FIG. 5(b) shows a perspective view of the appearance of the metals balls flattened into the metal lands.

To press and flatten the Au balls 13, a flattening jig 19 shown in FIG. 5, for example, is used. Because the bottom of the flattening jig 19 is accurately flatted, all Au balls 13 on the printed wiring board 1 are simultaneously flattened by pressing the flat surface of the jig against the Au balls 13 from the top. In this case, flattening is performed under a less pressure and in a shorter time by heating the bottom of the flattening jig 19 up to approx. 400° C.

Thus, in this embodiment, all Au balls 13 on the printed wiring board 1 are simultaneously flattened by using the flattening jig 19. According to this procedure, the variation in height of the wiring lands 4 due to the warpage and waviness of the surface of the printed wiring board I and the variation in film thickness of the wiring lands 4 is absorbed by the deformation of the Au balls 13. Therefore, Au lands 14 having the same height can be formed on the printed wiring board 1.

Moreover, in this embodiment, the Au lands 14 having a larger diameter are formed by pressing and flattening the Au balls 13. Therefore, the wiring lands 4 and the Au lands 14 on the wiring lands 4 contact each other at a larger area even if the contact area between the wiring land 4 and the Au balls 13 bonded to the wiring lands 4 is small because the positions of the wire lands 4 is shifted from the designed coordinates due to the misregistration and bleeding in printing and the shrinkage tolerance of ceramic in baking.

Figure 6:
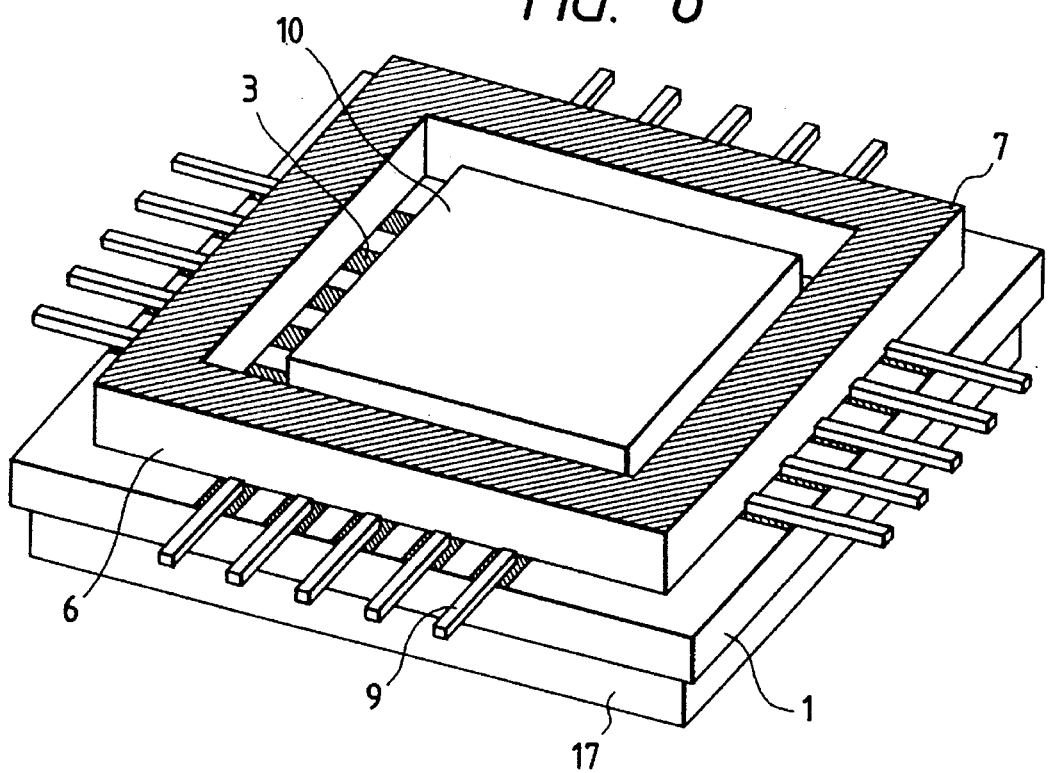
FIG. 6 shows a perspective view of the printed wiring substrate for illustrating a fabrication method of the semiconductor integrated circuit device according to the present invention.

Then, as shown in FIG. 6, the Au balls 12 of the semiconductor chip 10 are aligned with the corresponding Au lands 14 on the printed wiring board 1 to bond the Au ball 12 with the Au land 14 by thermo-compression bonding.

All Au balls 12 are simultaneously bonded to all Au lands 14 by heating the semiconductor chip 10 and printed wiring board 1 up to approx. ****300C and pressing the tool (not illustrated) against the back of the semiconductor chip 10 from the top. The pressure applied to the semiconductor chip 10 is, for example, approx. 100 gf for each Au ball 12.

Thus, in this embodiment, the Au balls 12 of the semiconductor chip 10 are bonded to the Au lands 14 on the printed wiring board 1 by thermo-compression bonding. Therefore, unlike the conventional CCB method, it is unnecessary to form solder resist and inner layer wirings for the prevention of solder flow and for control of CCB bump shape on the surface wirings 3 of the printed wiring substrate 1.

Figure 7:
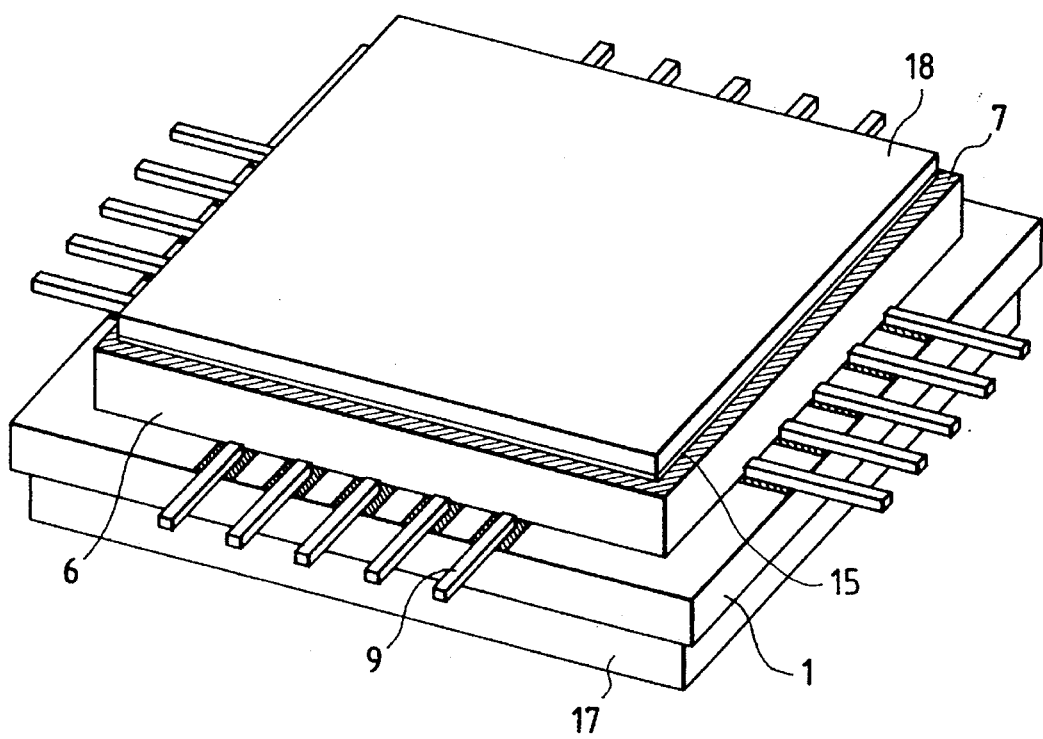
FIG. 7 shows a perspective view similar to FIG. 6, but with a cap attached.
Figure 8:
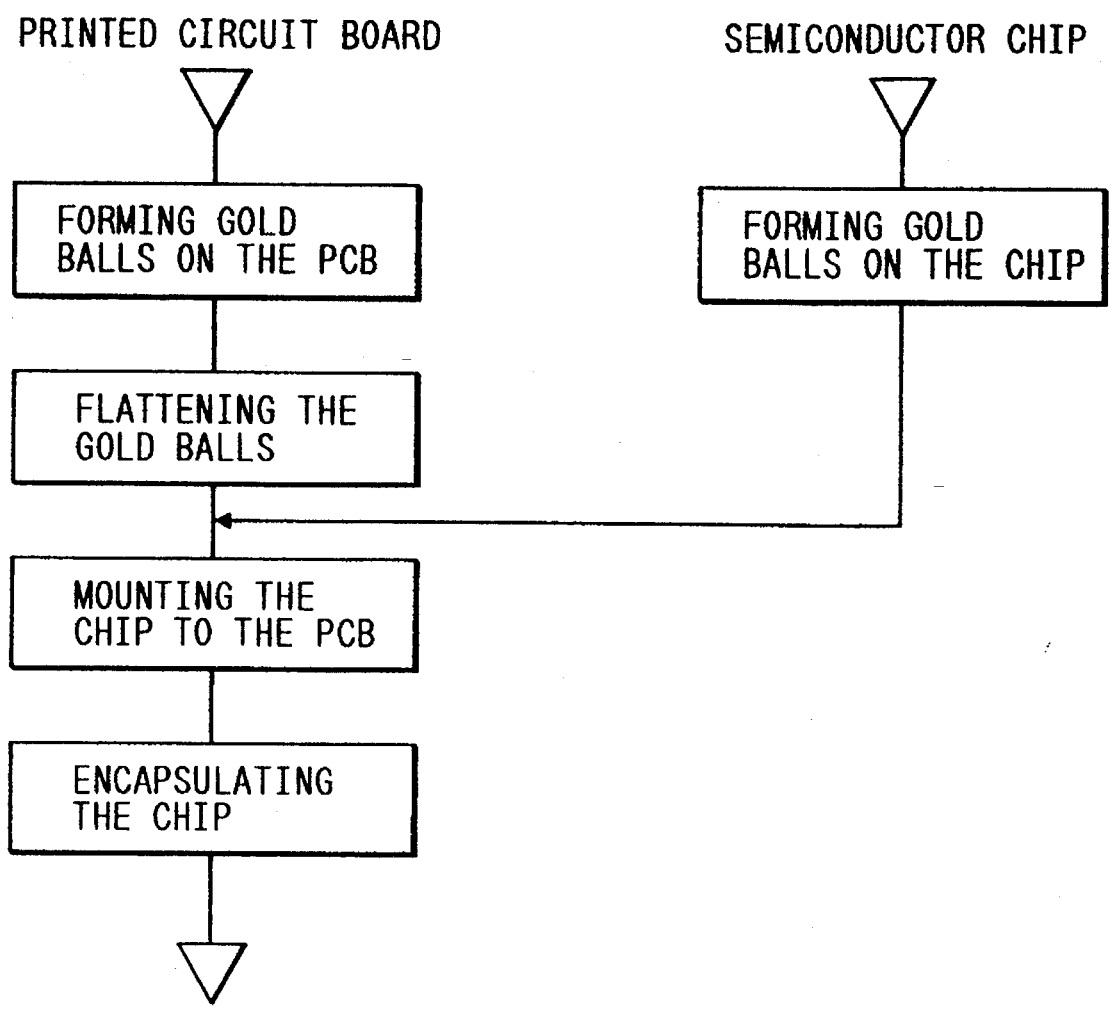
FIG. 8 shows a flow chart of the fabrication process of the semiconductor integrated circuit device according to the present invention.

Then, as shown in FIG. 7, the semiconductor integrated circuit device of this embodiment shown in FIG. 1 is completed by bonding the sealing metallize formed at the top of the sealing dam frame 6 on the printed wiring board 1 to the cap 18 by the brazing filler metal 15 for sealing. FIG. 8 shows a flow chart of the fabrication process described above.

This embodiment 1 of the above structure has the following advantages:

(1) It is unnecessary to form inner layer wirings for prevention of solder flow and for control of CCB bump shape on the printed wiring board 1 because the Au balls 12 of the semiconductor chip 10 are bonded to the Au lands 14 on the printed wiring board 1 by thermo-compression bonding. It is unnecessary to lay wirings for input/output signals on the printed wiring board 1.

Thereby, it is possible to form the input/output signal path on the printed wiring board 1 only by the surface wiring 3. Therefore, it is possible to decrease the transmission loss of high-frequency signals and improve the performance of a semiconductor integrated circuit device operated on a radio frequency.

(2) It is unnecessary to form solder resist for prevention of solder flow and for control of CCB bump shape on the printed wiring board 1 because the Au balls 12 of the semiconductor chip 10 are bonded to the Au lands 14 on the printed wiring board 1 by thermo-compressing bonding.

Thereby, because the characteristic impedances ($z_0$) of the surface wirings 3 can be easily adjusted by trimming the surface wiring 3 using a laser beam or the like and the performance of a semiconductor integrated circuit device operated on a radio frequency can be improved.

Thereby, because it is also possible to mount chip parts including capacitors on the surface of the printed wiring board 1, the terminal resistances of the surface wirings 3 can be easily adjusted and the performance of a semiconductor integrated circuit device operated on a radio frequency can be improved.

(3) It is possible to align the central positions of the Au balls 13 with those of the Au bumps 12 at a high accuracy because the Au balls 13 are bonded to the wiring lands 4 of the printed wiring board 1 by using the coordinates made by mirror-reversing the bonding coordinates used to bond the Au balls 12 to the electrode pads 11 of the semiconductor chip 10.

Moreover, it is possible to form Au lands 14 having the same height on the printed wiring board 1 because all Au balls 13 on the printed wiring board 1 are simultaneously flattened by using the flattening jig 19.

Furthermore, it is possible to increase the contact area between the wire lands 4 and Au lands 14 because the Au lands 14 having a larger diameter is formed by pressing and flattening the Au balls 13.

Thus, it is possible to improve the reliability of connection between the semiconductor chip 10 and printed wiring board 1.

(4) It is possible to decrease the thermal resistance of the semiconductor chip 10 because the semiconductor chip 10 is connected to the printed wiring board 1 through the Au balls 12 and Au lands 14 which have a smaller thermal resistance than solder.

That is, because the thermal resistance of Au is approx. $1/13$ the thermal resistance of, for example, Pb/Sn alloy solder containing 5% Sn, it is possible to quickly dissipate the heat produced by the semiconductor chip 10 to the printed wiring substrate 1 through the Au balls 12 and Au lands 14 and thus, the heat dissipation design of a package can be enhanced.

(5) It is possible to improve the life of connection between the semiconductor chip 10 and printed wiring board 1 because the semiconductor chip 10 is connected to the printed wiring board 1 using the Au balls 12 and Au lands 14 which cause less thermal fatigue breakage than solder.

(6) It is possible to improve the performance of a semiconductor integrated circuit device operated on a radio frequency because the semiconductor chip 10 is connected to the printed circuit board 1 through the Au balls 12 and Au lands 14 which have smaller electric resistances than solder.

(7) Expensive vacuum-deposition equipment and complex lift-off process are unnecessary because the Au balls 12 are bonded to the electrode pads 11 of the semiconductor chip 10 by a ball-bonding method. Thereby, it is possible to decrease the semiconductor integrated circuit device fabrication cost and improve the semiconductor integrated circuit device productivity.

(8) It is possible to decrease the rate of alpha rays generated from an electrode joint because the electrode uses Au which can be easily purified compared with solder. Thereby, it is possible to decrease the soft-error generation rate of an integrated circuit device.

Figure 9:
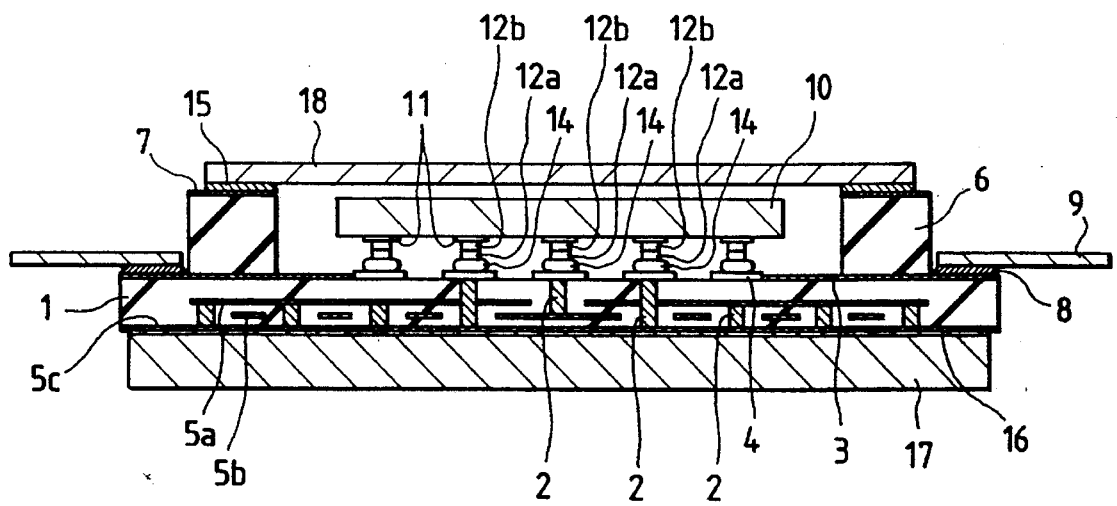
FIG. 9 shows a sectional view of a semiconductor integrated circuit device according to another aspect of the present invention.

Referring to FIG. 9, the semiconductor integrated circuit device of this embodiment is fabricated by bonding Au balls 12b to the electrode pads 11 of the semiconductor chip 10 by a known ball-bonding method using heat or ultrasonic energy or both, similar to the device shown in FIG. 1. However, the embodiment shown in FIG. 9 has second set of Au balls 12a bonded to the Au balls 12b. Both the Au balls 12a and 12b have the diameter of approx. 120 μm and the height of approx. 80 μm.

The diameter in the vertical direction of Au balls is substantially larger because the Au balls 12a and 12b are multistage-bonded to the electrode pads 11 of the semiconductor chip 10. Therefore, even though the variation of height of the wire lands 4 may exists due to the surface warpage and waviness of the printed circuit substrate 1 and the variation of the film thickness of the wiring lands 4 being large such that it cannot be absorbed only by the deformation of the Au balls 13, the height variation can be absorbed by the deformation of the Au balls 12a and 12b.

Thereby, it is possible to improve the reliability of connection between the semiconductor chip 10 and printed wiring board 1 even if the printed wiring board 1 having a large variation of the height of the wiring lands 4 is used.

Moreover, it is possible to decrease the damage done to the semiconductor chip 10 during thermo-compressing bonding because the pressure applied to the back of the semiconductor chip 10 is absorbed by the deformation of the Au balls 12a and 12b when bonding the Au balls 12a to the Au lands 14 by thermo-compressing bonding.

Figure 10:
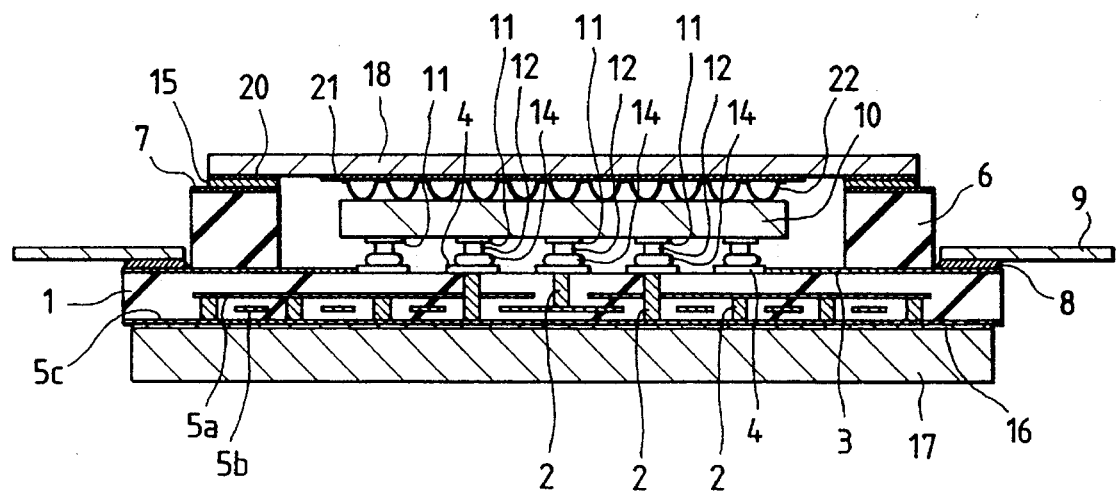
FIG. 10 shows a sectional view of a semiconductor integrated circuit device according to another aspect of the present invention.
Figure 11:
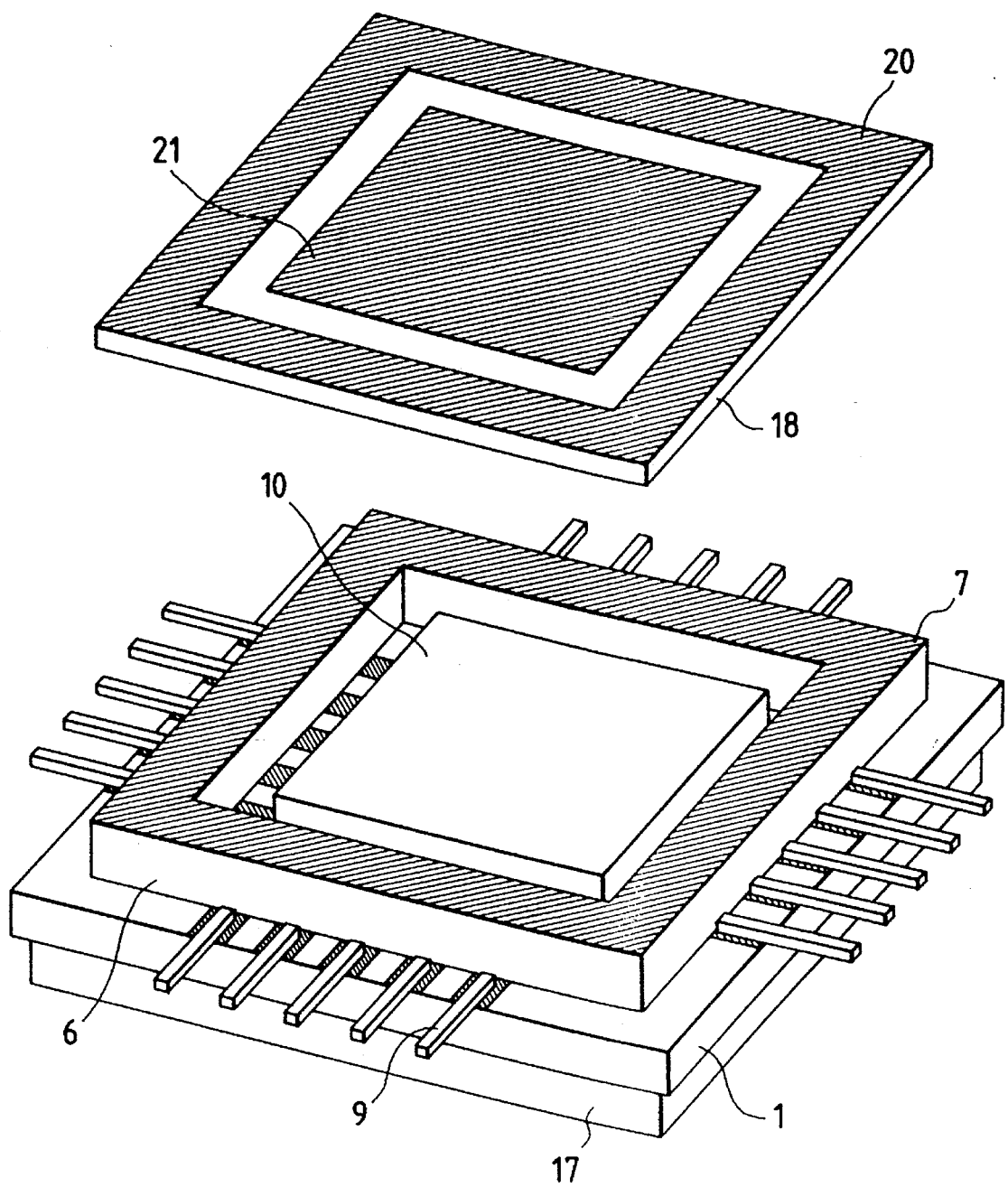
FIG. 11 shows a perspective view of a cap and a printed wiring substrate for illustrating the fabrication method of the semiconductor integrated circuit device according to another aspect of the present invention.

FIG. 10 shows a semiconductor integrated circuit device similar to the one shown in FIG. 1. However, in this embodiment, a heat conductive media of Au ribbons 22 is provided in the space between the back of a semiconductor chip 10 mounted on a printed circuit board 1 and the bottom of a cap 18 to cool the semiconductor chip 10 by conducting heat through the cap.

Both ends of the Au ribbons 22 are bonded to a heat conductive medium forming metallize 21 provided on the bottom of the cap 18, and the central portions of them contact the back of the semiconductor chip 10.

The process for forming the heat conductive media of the semiconductor integrated circuit device of the embodiment 3 is described below by referring to FIGS. 11 to 14.

First, the printed circuit board 1 connected to the semiconductor chip 10 and the cap 18 are prepared. The cap 18 is of a metallic plate, for example, a Cu thin plate which is easily bent.

The heat conductive media forming metallize 21 is formed on the heat conductive media forming area of the cap 18 and the sealing metallize 20 is formed on a marginal part of the cap. The heat conductive media forming metallize 21 and the sealing metallize 20 are of thick films of a refractory metal such as W plated with Ni and Au.

Figure 12:
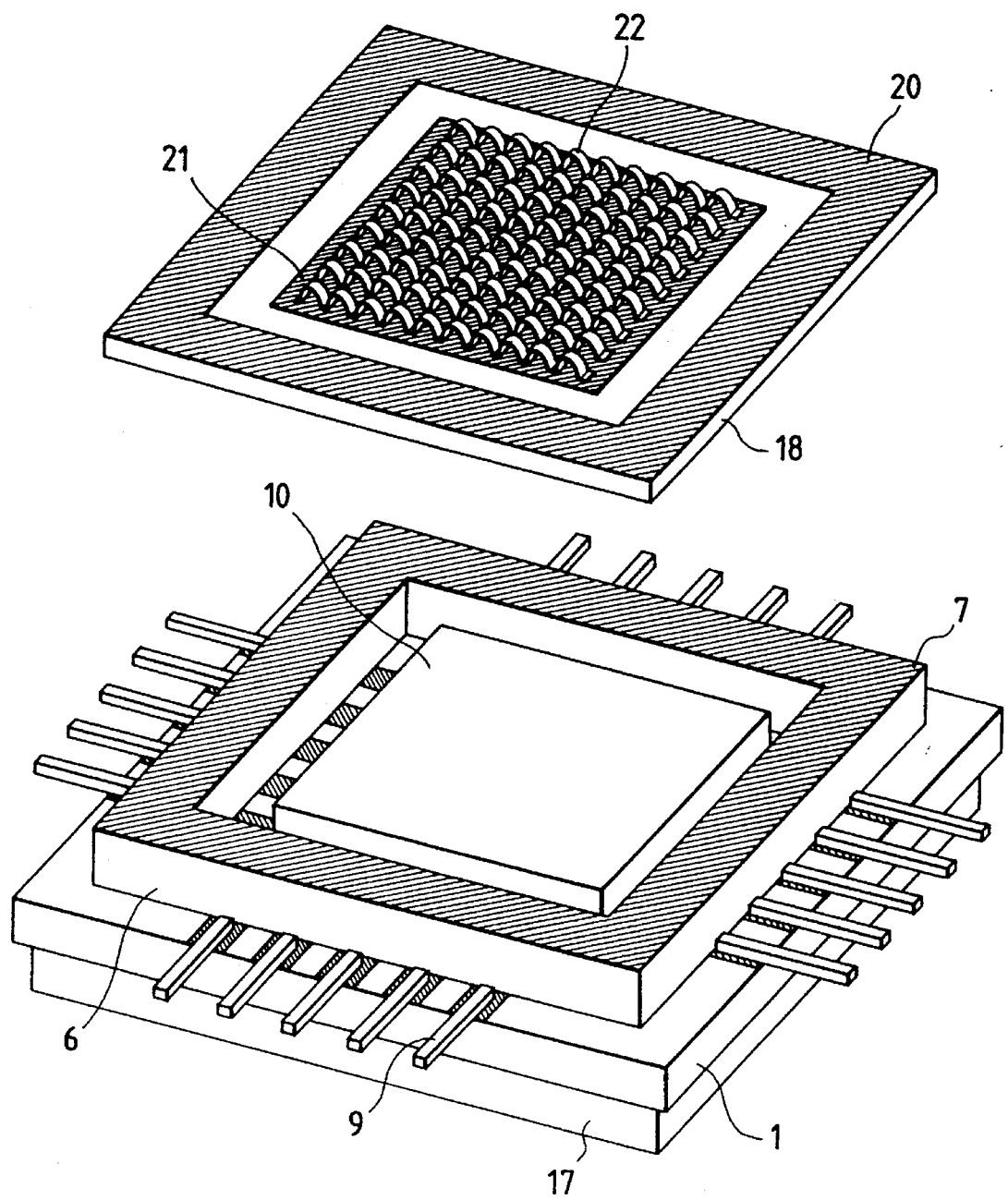
FIG. 12 shows a perspective view of a cap and a printed circuit substrate for illustrating the fabrication method of the semiconductor integrated circuit device according to another aspect of the present invention.

Then, as shown in FIG. 12, the Au ribbons 22 are bonded to the heat transfer medium forming metallize 21 of the cap 18 by a known ribbon bonding method using heat or ultrasonic energy or both. The Au ribbons are made by bonding, for example, an Au tape having a thickness of approx. 20 μm and a width of approx. 300 μm in the form of a loop, and the height of the loop is approx. 300 to 1,000 μm.

Figure 13:
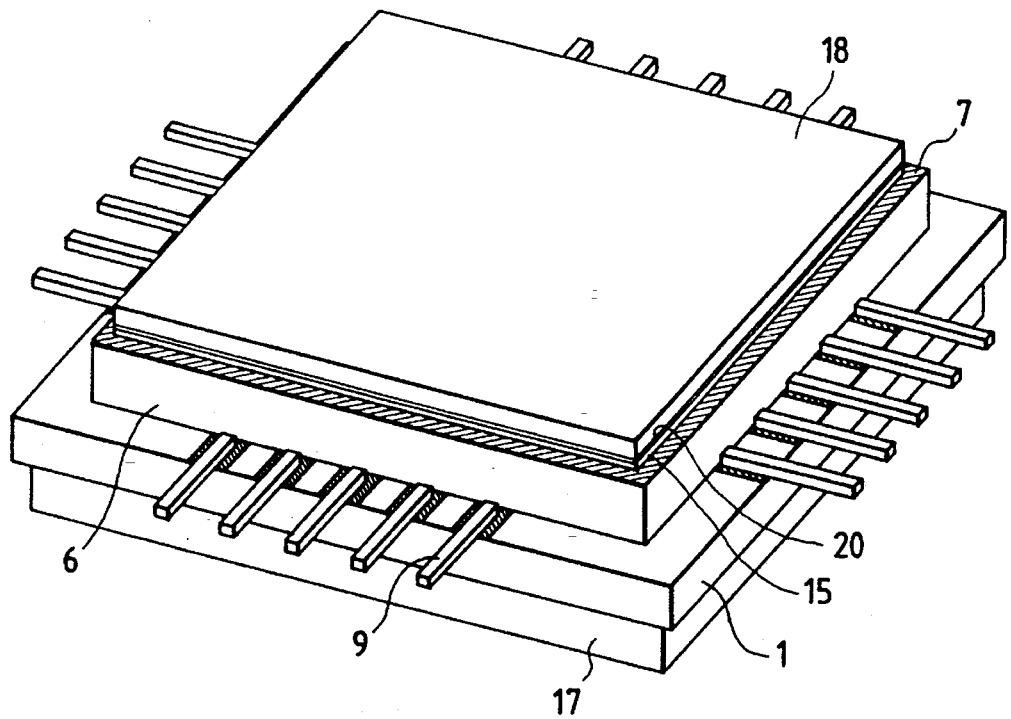
FIG. 13 shows a perspective view similar to FIG. 12, but with the cap attached.
Figure 14:
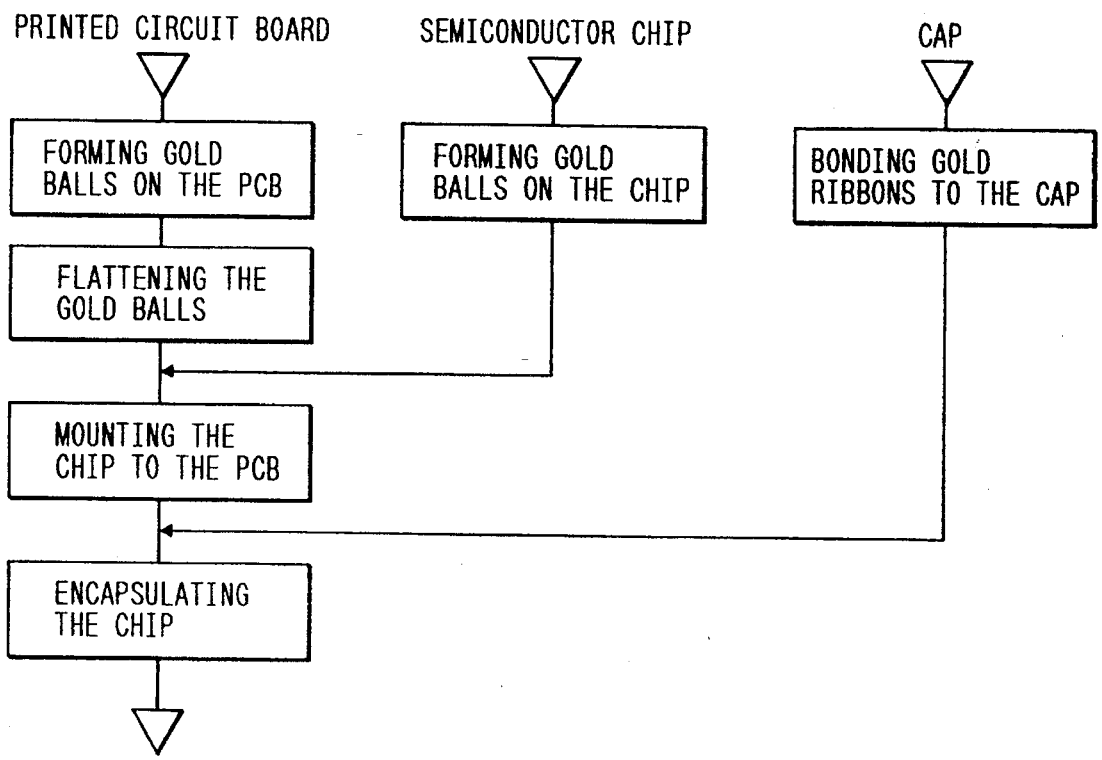
FIG. 14 shows a flow chart of the fabrication process of the semiconductor integrated circuit device according to another aspect of the present invention.

Then, as shown in FIG. 13, the sealing metallize 7 on the sealing dam frame 6 is bonded to the sealing metallize 20 on the marginal part of the cap 18 by the brazing filler metal 15 for sealing.

In this case, if the cap 18 is a metallic plate such as a Cu thin plate which is easily bent, it is deformed toward the inside of the cavity due to the atmospheric pressure after the bonding by the brazing filler metal 15 and the package is cooled and thereby, the inside of the cavity comes to a negative pressure. Therefore, it is possible to securely contact the Au ribbons 22 to the back of the semiconductor chip 10.

The embodiment 3 of the above structure have the following advantages.

(1) It is possible to decrease the thermal resistance of the semiconductor chip 10 even if a large amount of heat is produced by the semiconductor chip 10 by providing the heat conductive media comprising the Au ribbons 22 between the back of the semiconductor chip 10 and the bottom of the cap 18 and dissipating the heat produced by the semiconductor chip 10 not only from the printed circuit board 1 but from the back of the semiconductor chip 10 through the Au ribbons 22 to the cap 18.

(2) In the case of a package in which a semiconductor chip is connected to a printed wiring board by the CCB method, it is difficult to dissipate the heat produced by the semiconductor chip to the printed wiring board through CCB bumps because solder forming the CCB bumps has a large thermal resistance. Therefore, for example, some semiconductor devices have a heat dissipating structure in which solder is provided in the space between the back of the semiconductor chip and the bottom of the cap to dissipate the heat of the semiconductor chip through the solder.

However, the above heat dissipating structure in which the semiconductor chip and the cap are joined by solder has a problem in the reliability of connection between the semiconductor chip and printed wiring board because the stress produced due to the difference of thermal expansion coefficient between the printed circuit board, cap, solder, and semiconductor chip is easily applied to the CCB bumps.

Whereas, the embodiment 3 in which the easily deformable Au ribbons 22 is provided in the space between the back of the semiconductor chip 10 and the bottom of the cap 18 has the structure in which the stress produced due to the difference of thermal expansion coefficient between the printed circuit board 1, cap 18, and semiconductor chip 10 is absorbed by the deformation of the Au ribbons 22.

Thereby, because the stress applied to the Au balls 12a and Au lands 14 which are the connection between the semiconductor chip 10 and printed wiring board 1 is decreased, it is possible to improve the reliability of connection between the semiconductor chip 10 and printed wiring board 1.

Figure 15:
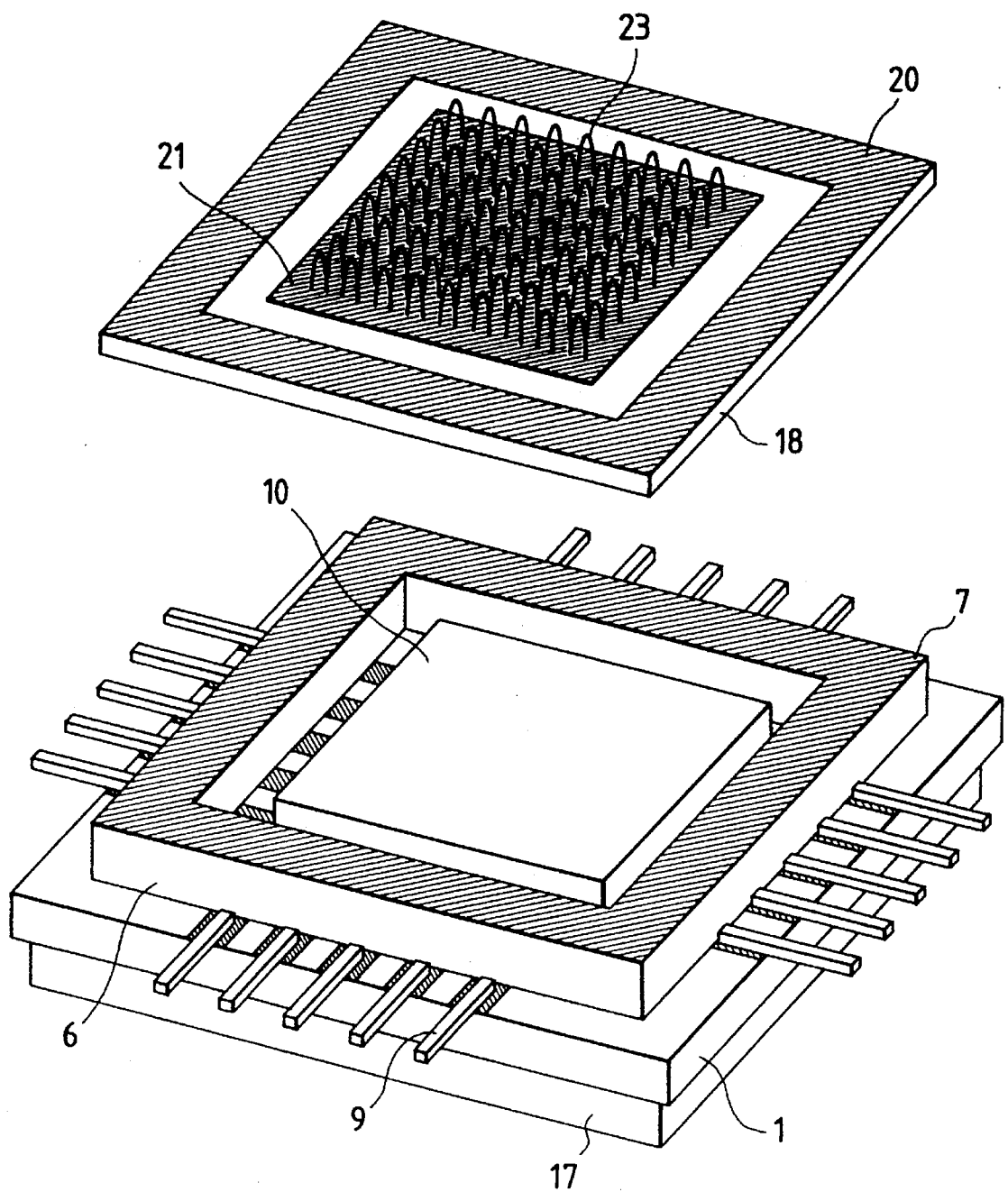
FIG. 15 shows a perspective view of a cap and a printed circuit substrate for illustrating the fabrication method of the semiconductor integrated circuit device according to another aspect of the present invention.

Referring to FIG. 15, the semiconductor integrated circuit device of the embodiment 4 uses Au wires 23 instead of the Au ribbons 22 as heat conductive media. The Au wires 23 are bonded to the heat conductive media forming metallize 21 of the cap 18 by a known wire bonding method using heat or ultrasonic energy or both. Because this embodiment can allow the heat produced by the semiconductor chip 10 to escape not only from the printed wiring board 1 but from the back of the semiconductor chip 10 through the Au wires 23 to the cap 18, the thermal resistance of the semiconductor chip 10 can be decreased similarly to the embodiment shown in FIG. 10 even if a large amount of heat is produced by the semiconductor chip 10.

Figure 16:
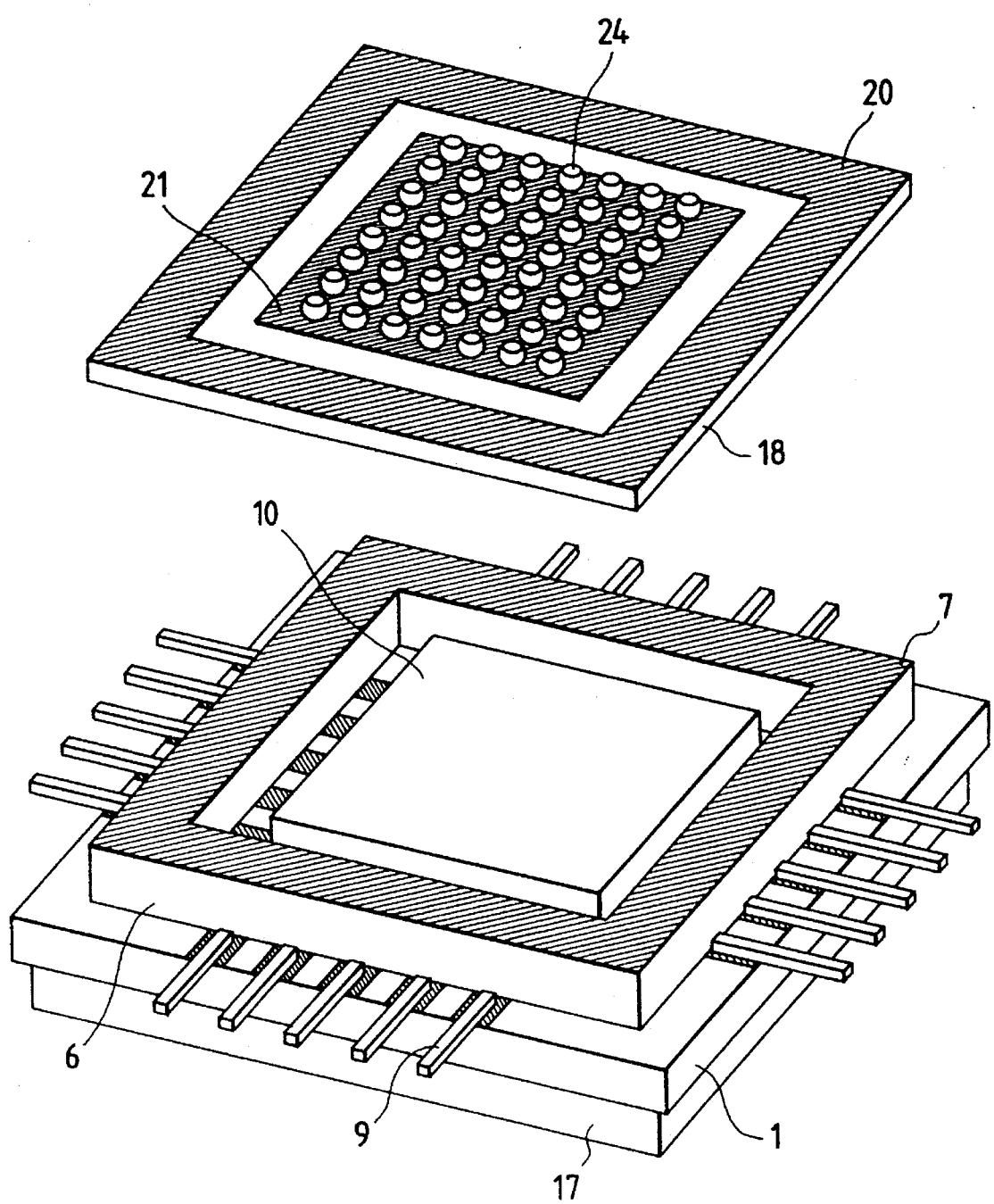
FIG. 16 shows a perspective views of a cap and a printed circuit substrate for illustrating the fabrication method of the semiconductor integrated circuit device according to another aspect of the present invention.

Referring to FIG. 16, the semiconductor integrated circuit device uses Au balls 24 as heat conductive media instead of the ribbons and wires. The Au balls 24 are bonded to the heat transfer medium forming metallize 21 of the cap 18 by a known ball bonding method using heating or ultrasonic energy or both similarly to the case when bonding the Au balls 12a to the electrode pads 11 of the semiconductor chip 10.

Figure 17:
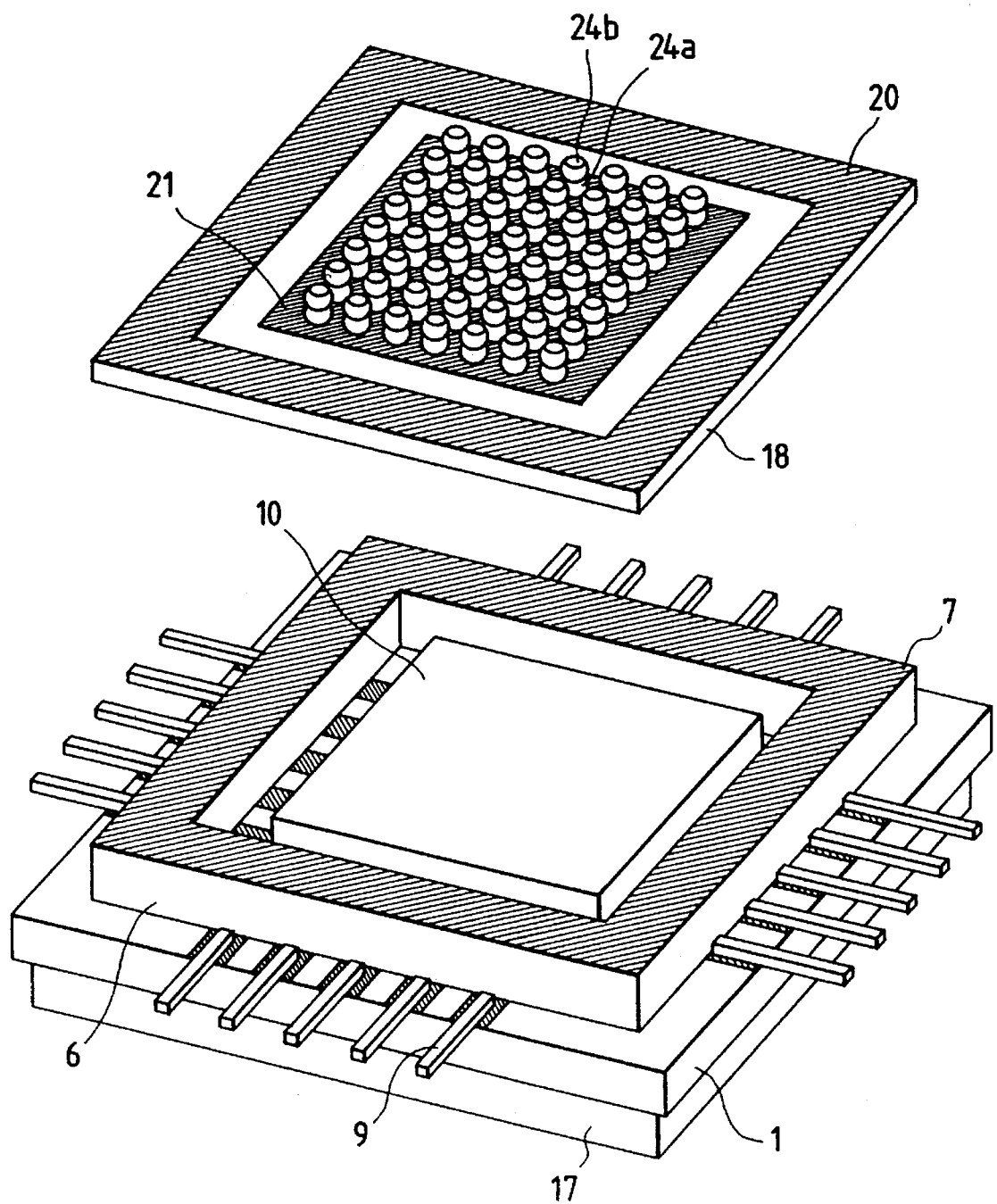
FIG. 17 shows a perspective view of a cap and a printed circuit substrate for illustrating the fabrication method of the semiconductor integrated circuit device according to another aspect of the present invention.

In this case, as shown in FIG. 17, it is also possible to further bond Au balls 24b to Au ball 24a bonded to the heat conductive media forming metallize 21 of the cap 18.

This embodiment allows the heat produced by the semiconductor chip 10 not only from the printed wiring board 1 but from the back of the semiconductor chip 10. Therefore, it is possible to decrease the thermal resistance of the semiconductor chip 10 similarly to the embodiments that use wires and ribbons even if a large amount of heat is produced by the semiconductor chip 10.

Figure 18:
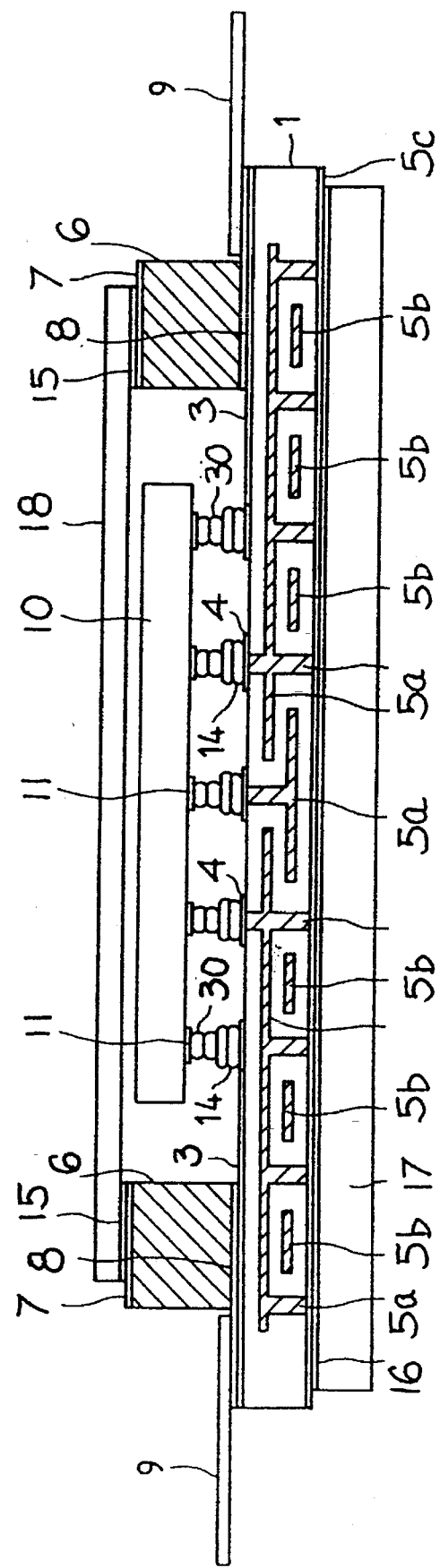
FIG. 18 is a sectional view of a semiconductor integrated circuit device according to another aspect of the present invention.
Figure 19:
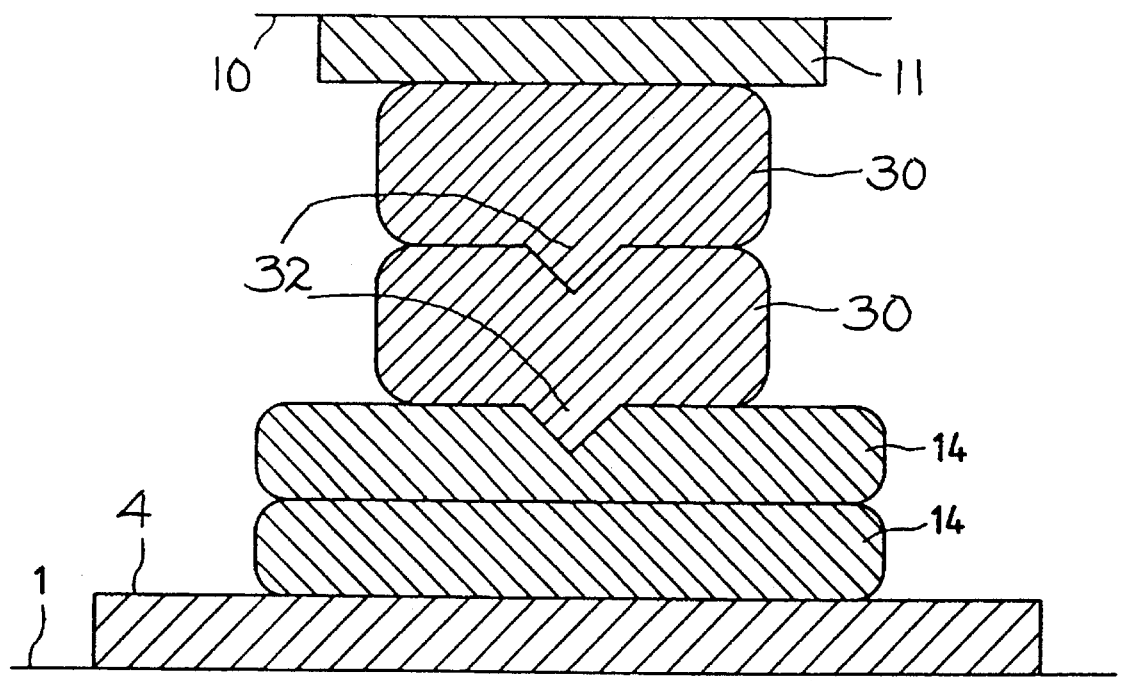
FIG. 19 is a sectional view showing a metal ball with an anchor embedded into a metal land.

FIG. 18 shows a semiconductor device which is substantially similar to the embodiment shown in FIG. 1. However, FIG. 18 shown an embodiment where two Au lands 14 are overlaid and joined onto the electrode 4. On the other hand, an pair of Au ball 30 having smaller diameter than that of the Au land 14 are provided on each of the electrode pads 11 of the semiconductor chip 10. It is to be noted that one or more than two lands 14 and balls can also be overlaid as desired. The wiring substrate 1 and the semiconductor chip 10 are electrically connected by the thermo compression bonding of the Au land 14 and the Au ball 30. As shown in FIG. 19, the Au ball 30 of the semiconductor chip 10 is provided with an anchor 32 having a sharpened tip, where the anchor 32 is embedded into the Au land 14 on the electrode 4 of the wiring substrate 1.

A manufacturing method of a semiconductor integrated circuit device having the above-mentioned constitution will be described using FIGS. 20–39.

Figure 20:
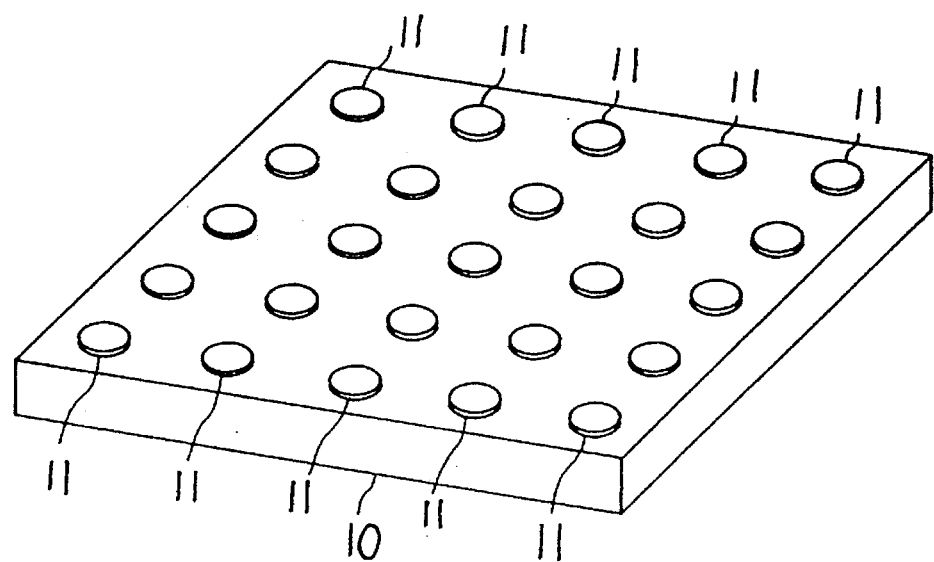
FIG. 20 is a perspective view of a semiconductor chip with electrode pads formed on an element forming surface.
Figure 21A:
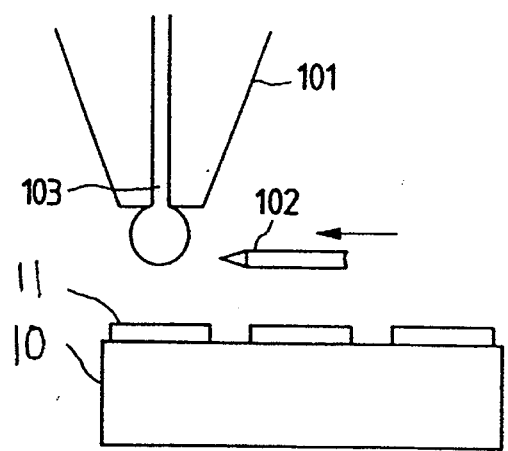
FIGS. 21(a)–(d) are schematic diagrams showing a method of forming a metal ball on an electrode pad of a semiconductor chip.
Figure 21B:
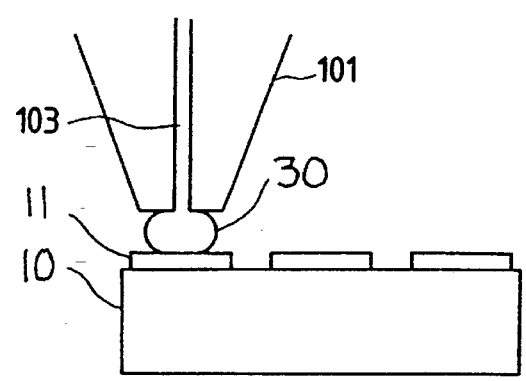
Figure 21C:
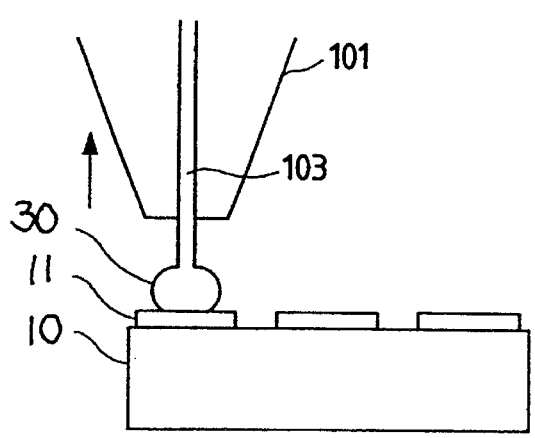
Figure 21D:
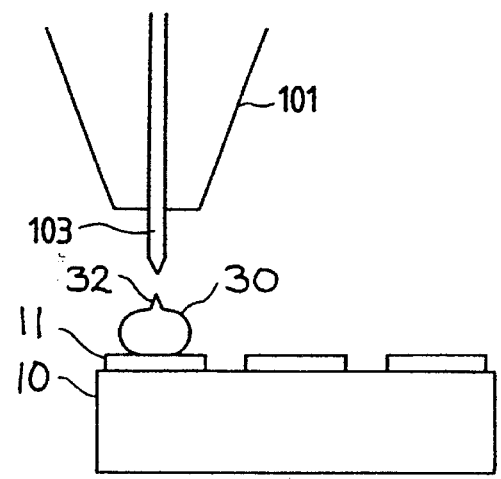
Figure 21E:
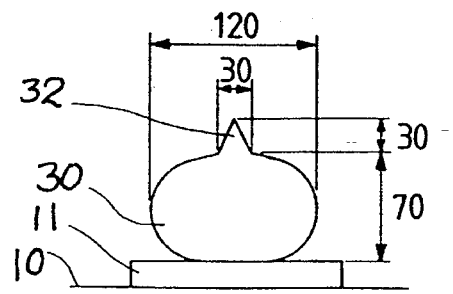
FIG. 21(e) is a diagram showing outer dimension of a metal ball.

As shown in FIG. 20, a semiconductor chip 10 having electrode pads 11 being many terminals formed on an element forming surface is prepared. The electrode pad 11 is made of gold (Au). Next, as shown in FIGS. 21(a)–(d), an Au ball 30 being a first metal ball is formed on the electrode pad 11 by a well-known ball bonding method described above. That is, the semiconductor chip 10 is positioned on a stage of a wire bonding apparatus (not shown), and as shown in FIG. 21(a), a gold ball 30 is formed at a tip of an Au wire 103 using a torch 102. The gold ball 30 is joined onto the electrode pad 11 as shown in FIG. 21(b). Next, only a capillary 101 is elevated as shown in FIG. 21(c), and then if the Au wire 103 is elevated and cut at a neck of the Au ball 30 as shown in FIG. 21(d), an anchor 32 extending in the direction away from the electrode pad 11 and having a sharpened tip is formed at the top end portion of the ball 30. An example of outer dimension of the Au ball is shown in FIG. 21(e), the dimension unit being μm.

Figure 22:
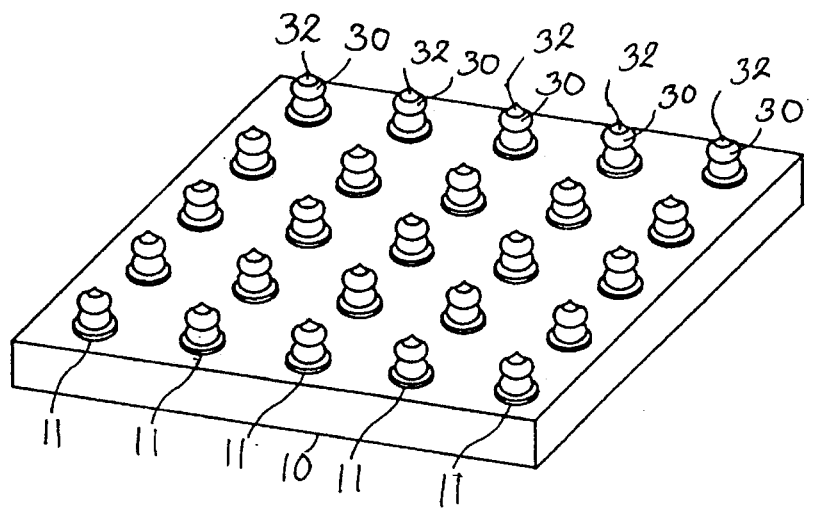
FIG. 22 is a perspective view of a semiconductor chip with metal balls formed on electrode pads.

Next, in a similar method, another Au ball 30 is joined onto the above-mentioned Au ball 30. Thus, Au balls 30 are formed in sequence on all electrode pads 11, and a semiconductor chip 10 is obtained as shown in FIG. 22.

Figure 23:
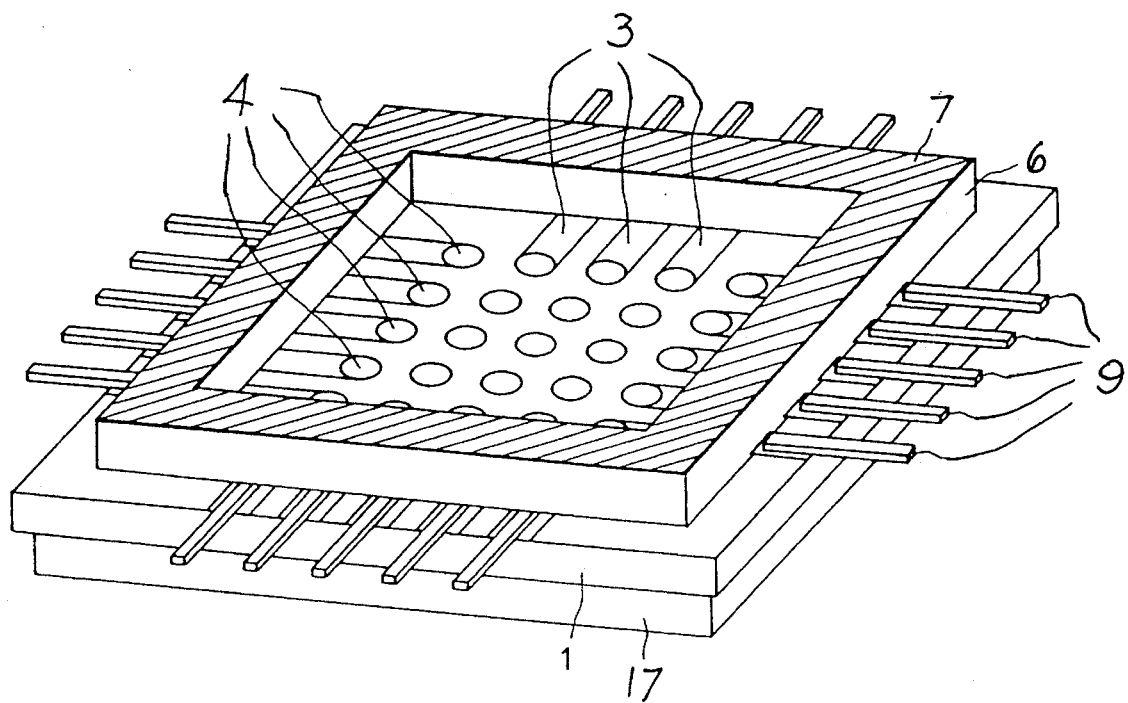
FIG. 23 is a perspective view of a wiring substrate with electrodes formed on a main surface.
Figure 24:
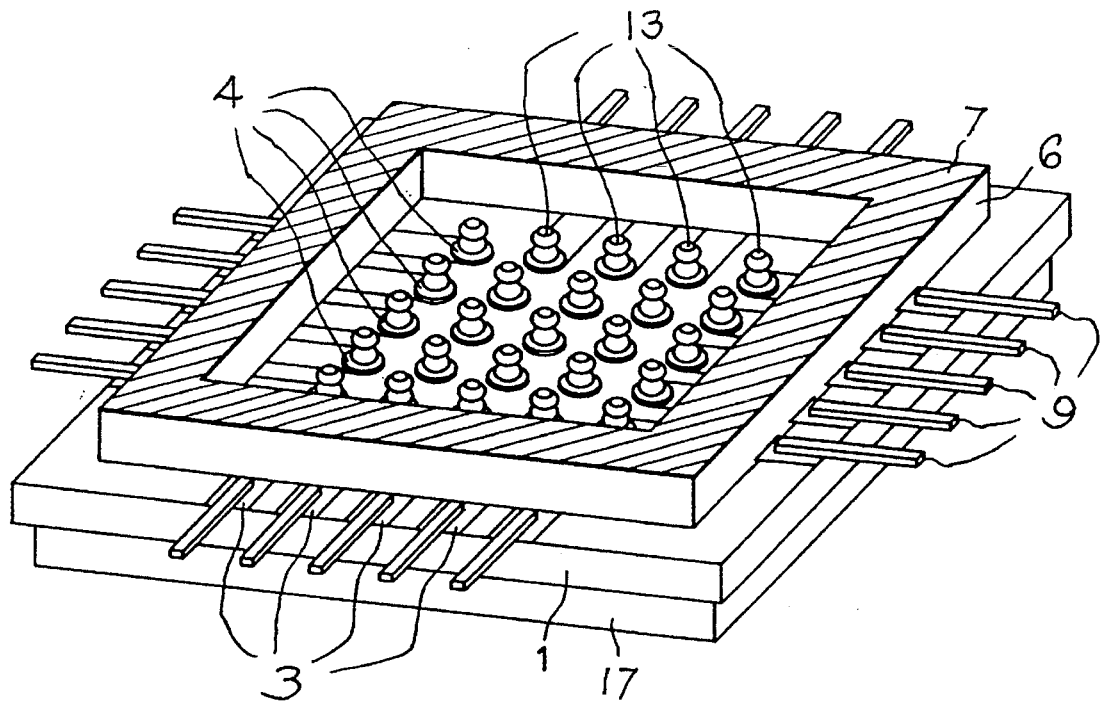
FIG. 24 is a perspective view of a wiring substrate with metal balls formed on electrodes according to another aspect of the present invention.

On the other hand, as shown in FIG. 23, a wiring substrate 1 with a number of electrodes 4 formed thereon is prepared, and a pair of Au balls 13 (second metal balls) are overlaid and formed on each electrode 4 by the above-mentioned ball bonding method, thereby obtaining a wiring substrate 1 as shown in FIG. 24. Outer dimension of the Au ball 13 is the same as that of the Au ball 30 formed on the electrode pad 11 of the semiconductor chip 10. In this connection, an anchor 32 is formed also on the upper end portion of the Au ball 13, but has not been represented in the drawings for convenience. When the Au ball 13 is formed on the electrode 5 of the wiring substrate 1, inverted coordinates of the bonding coordinates used in forming the Au ball 30 on the electrode pad 11 of the semiconductor chip 10 are used. Even if the position of the electrode 4 is deviated from the designed coordinates due to the printing deviation or the contraction tolerance of the wiring substrate 1, the center position of the Au ball 13 and the center position of the Au ball 30 can coincide at high accuracy.

Figure 26:
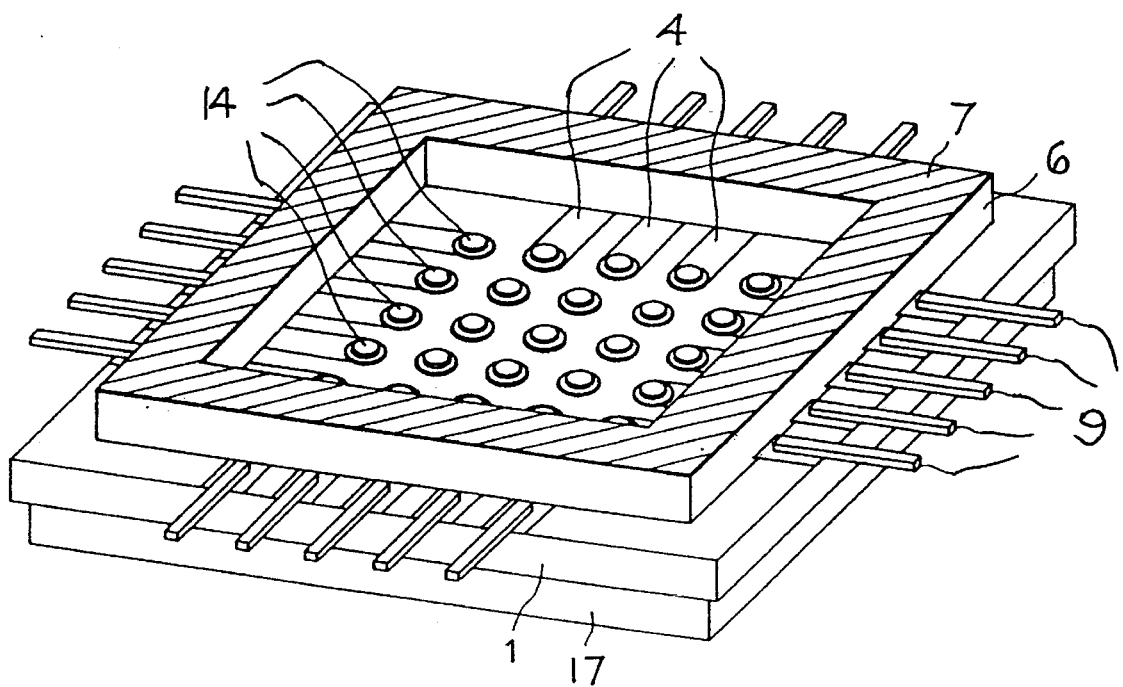
FIG. 26 is a perspective view of a wiring substrate with metal lands formed on electrodes according to another aspect of the present invention.

Next, the wiring substrate 1 is put on a horizontal stage 114 as shown in FIG. 25 and compression bonding of a tool 110 is carried out to the Au balls 13 from upper side and the upper surface is flattened, that is, height of the top of the second metal balls 13 is equalized, thereby Au lands 14 (metal electrodes) as shown in FIG. 26 are formed on the electrodes 4 of the wiring substrate 1. Then, the load applied to the Au balls 13 is about 300 gf per one Au ball 13. Also the tool 110 has the bottom surface flattened at high accuracy. Further, the tool 110 is heated to about 4000C, thereby the load applied to the Au ball 13 can be decreased.

Thus, since all Au balls 13 on the wiring substrate 1 are flattened together at the same time, dispersion of height of the Au balls 13 caused by warp or undulation of the main surface of the wiring substrate 1 can be absorbed and height of the Au lands 14 on all electrodes 5 can be equalized at high accuracy.

Figure 27:
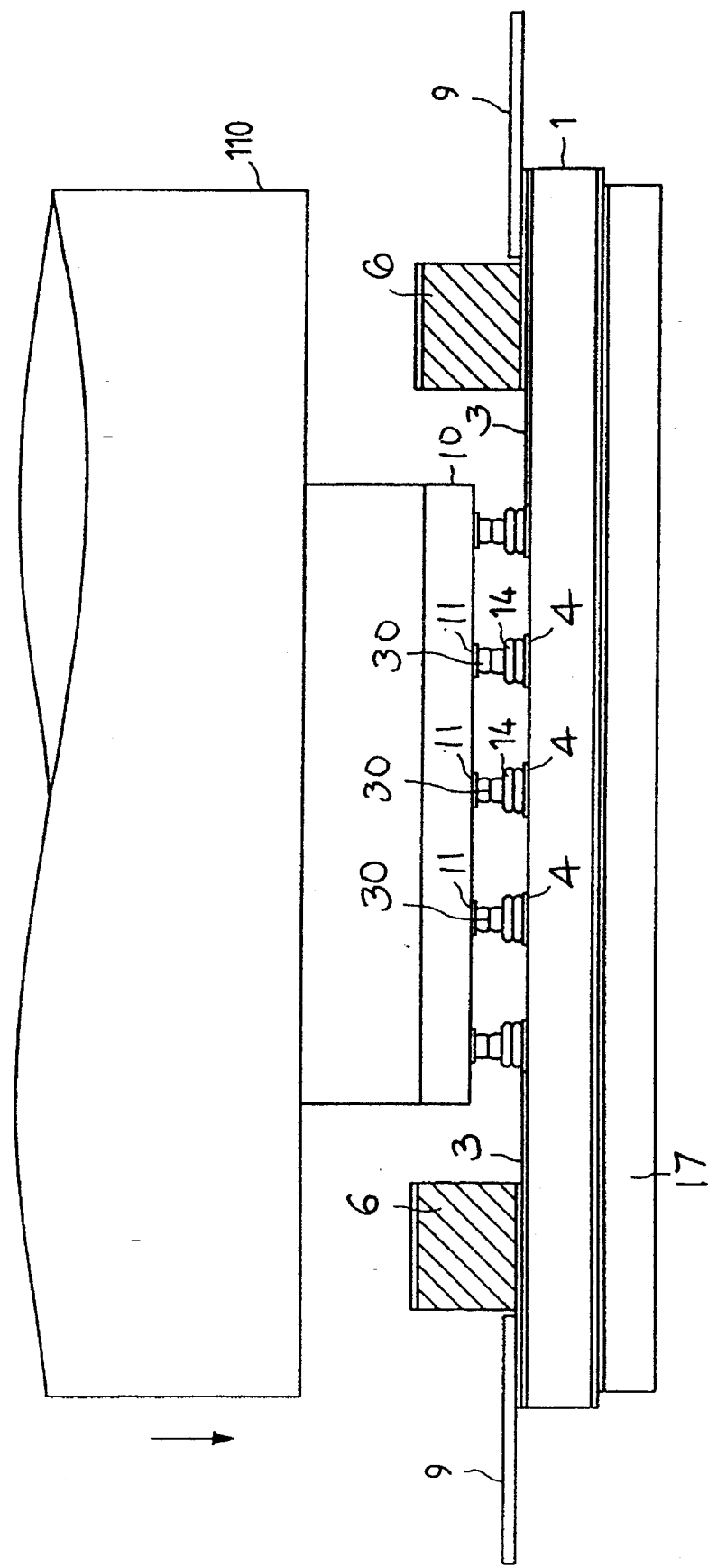
FIG. 27 is a schematic diagram showing a method of thermo-compression bonding of metal balls of a semiconductor chip and metal lands of a wiring substrate according to the present invention.
Figure 28A:
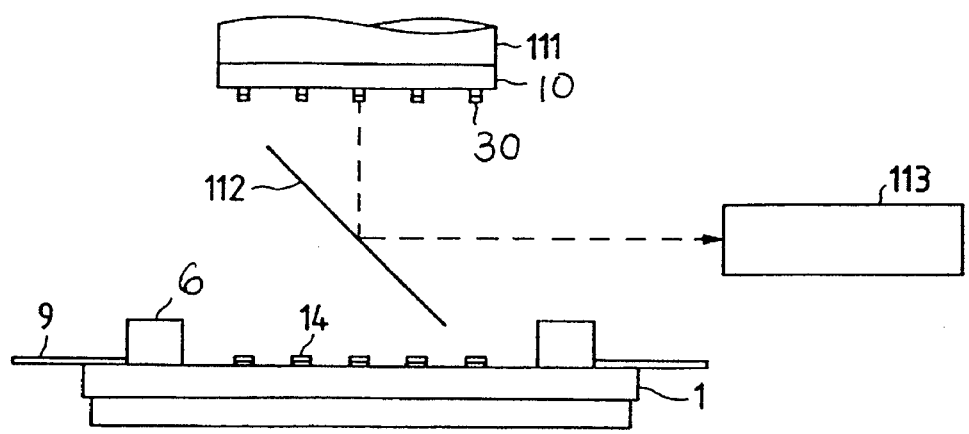
FIGS. 28(a)–(c) are schematic diagrams showing a method of positioning metal balls of a semiconductor chip and metal lands of a wiring substrate according to the present invention.
Figure 28B:
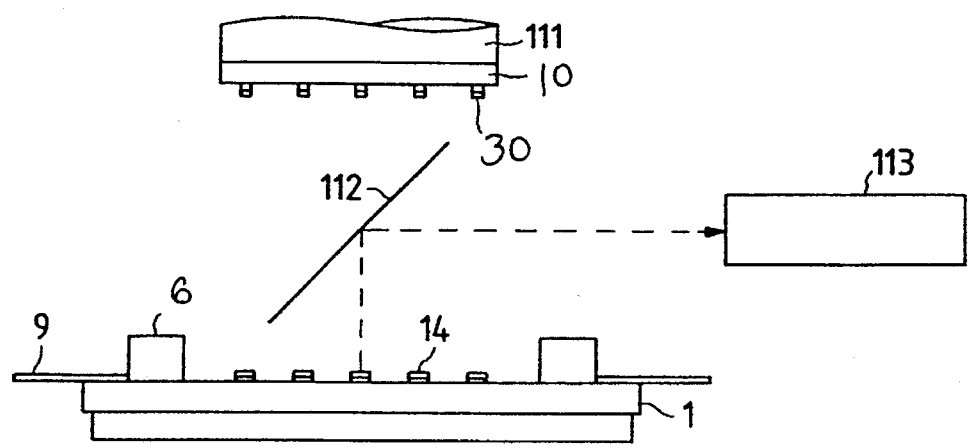
Figure 28C:
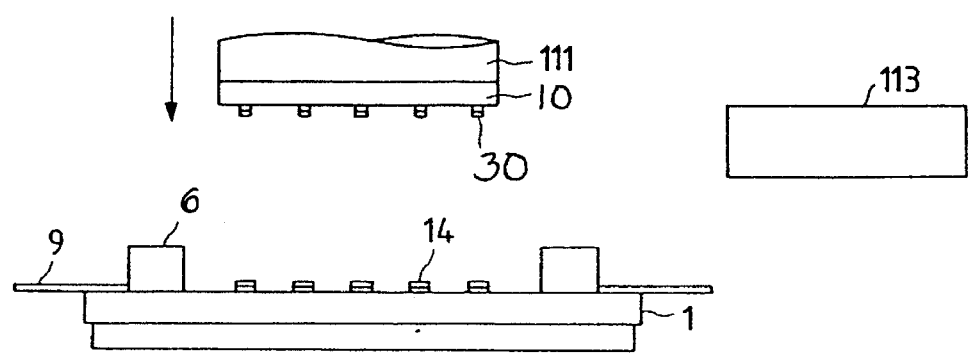

Next, as shown in FIG. 27, the semiconductor chip 10 with the Au balls 30 formed on the electrode pads 11 are attached to the bottom surface of the tool 111 for thermo-compression bonding, and the Au balls 30 of the semiconductor chip 10 and the Au lands 14 of the wiring substrate 1 corresponding to the Au balls 30 are overlaid each other and joined by thermo-compression bonding. The Au balls 30 and the Au lands 14 are electrically connected by embedding the anchors 32 into the Au lands 14. In order that the Au balls 30 of the semiconductor chip 10 and the Au lands 14 of the wiring substrate 1 are overlaid correctly, at first, a pattern of the Au balls 30 is recognized using a half mirror 112 and a picture analyzing apparatus 113 as shown in FIG. 28(a). Next, the half mirror 112 is rotated by 90° and a pattern of the Au land 14 of the wiring substrate 1 is recognized as shown in FIG. 28(b). Next, the semiconductor chip 10 is moved or rotated longitudinally and laterally and the image of pattern of the Au balls 30 and the Au lands 14 are overlaid upon each other, and then the tool 111 is lowered onto the wiring substrate 1 as shown in FIG. 28(c), and all Au balls 30 and all Au lands 14 are subjected to thermo-compression bonding at the same time. Then, as shown in FIG. 19, the anchors 32 of the Au balls 30 are embedded into the Au lands 14.

When the above-mentioned thermo compression bonding is carried out, the Au balls 30 are heated at a lower temperature (about 250° C.) than the recrystallization temperature of Au (about 300° C.), and the Au lands 14 of the wiring substrate 1 is heated at a higher temperature (about 350° C.) than the recrystallization temperature of Au. Since the Au land 14 of the wiring substrate 1 becomes softer than the Au ball 30 of the semiconductor chip 10, the anchor 32 of the Au ball 30 can be securely embedded into the Au land 14 with a little load.

Figure 29:
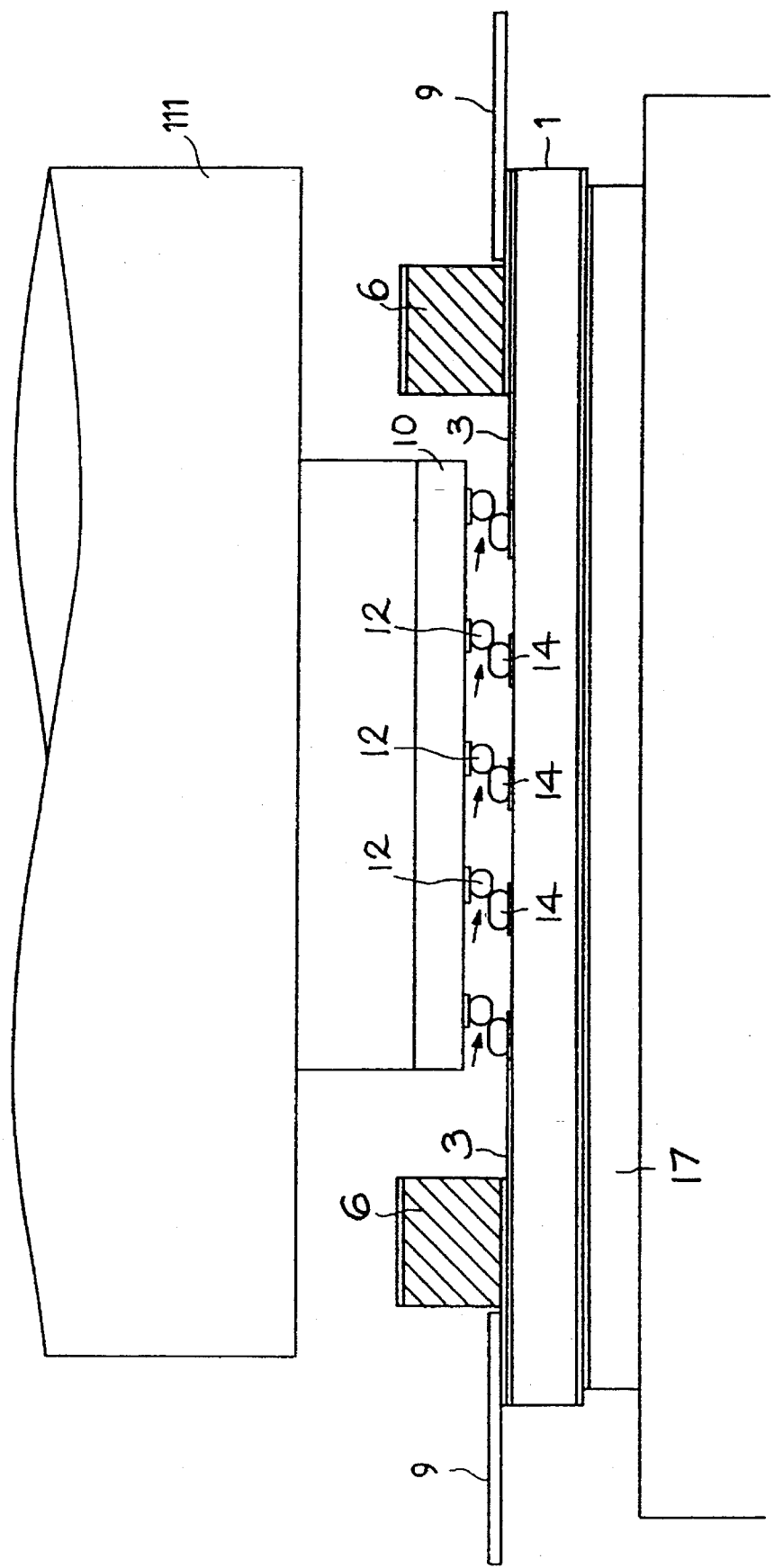
FIG. 29 is a schematic diagram showing the state in which joint failure is produced between metal balls of a semiconductor chip and metal lands of a wiring substrate.
Figure 30:
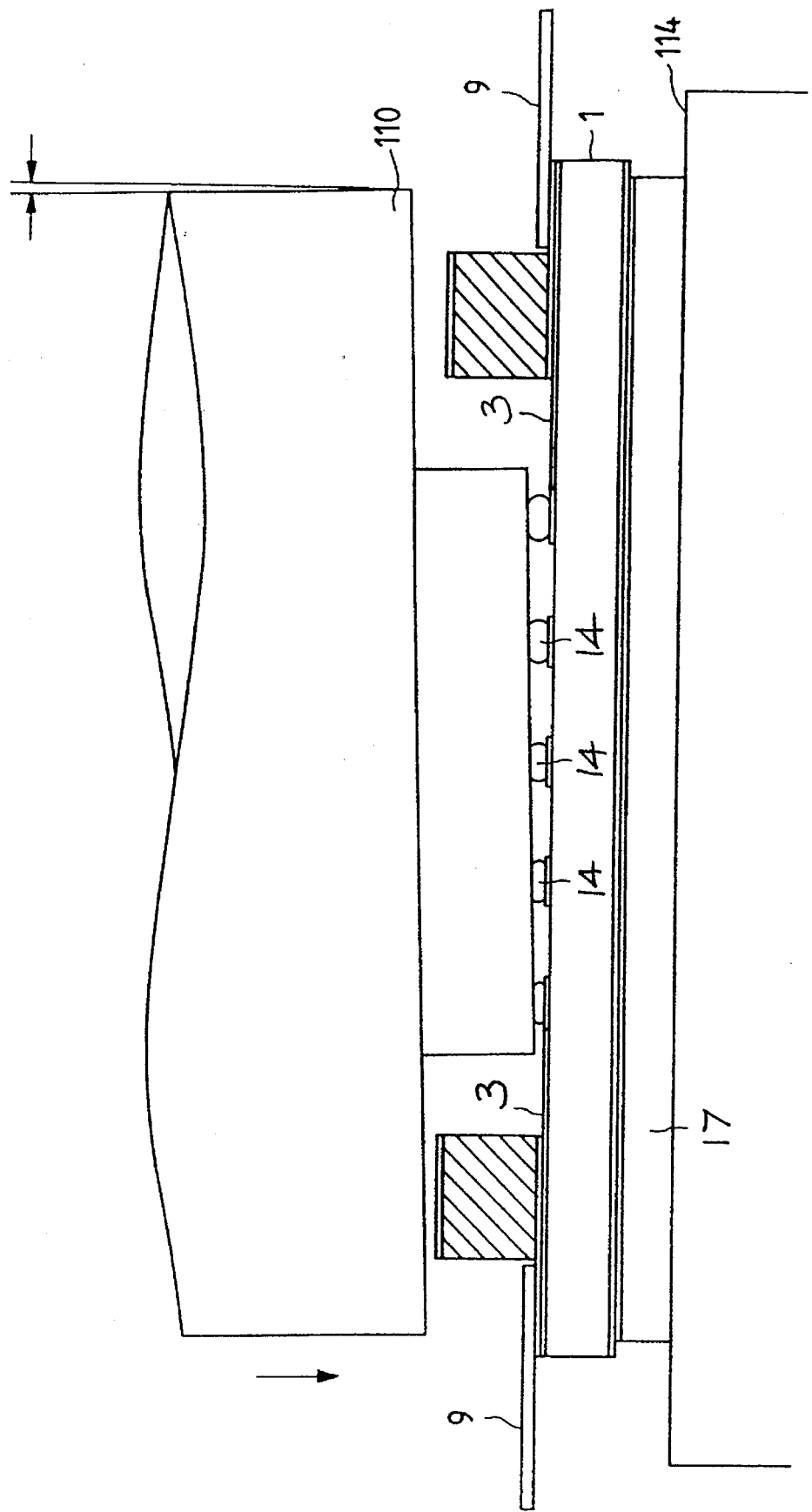
FIG. 30 is a schematic diagram showing a flattening method of metal balls.

On the other hand, as shown in FIG. 29, when the Au balls 12 having no anchors 32 are formed on the electrode pad 11 of the semiconductor chip 10 are joined to the Au lands 14 using thermo-compression bonding, if the center position of the Au balls 12 and the center position of the Au lands 14 are slightly deviated or direction of the load applied to the rear surface of the semiconductor chip 10 is slightly deviated from the vertical direction with respect to the main surface of the wiring substrate 1, the Au ball 12 slips in the lateral direction and the joining failure is liable to occur between the Au balls 12 and the Au lands 14.

According to one aspect of the present invention, where the anchors 32 are provided at the upper end position of the Au balls 30, since the anchors 32 bite into the Au lands 14, slippage of the Au balls 30 is prevented and the Au balls 30 and the Au lands 14 can be securely joined.

Figure 31:
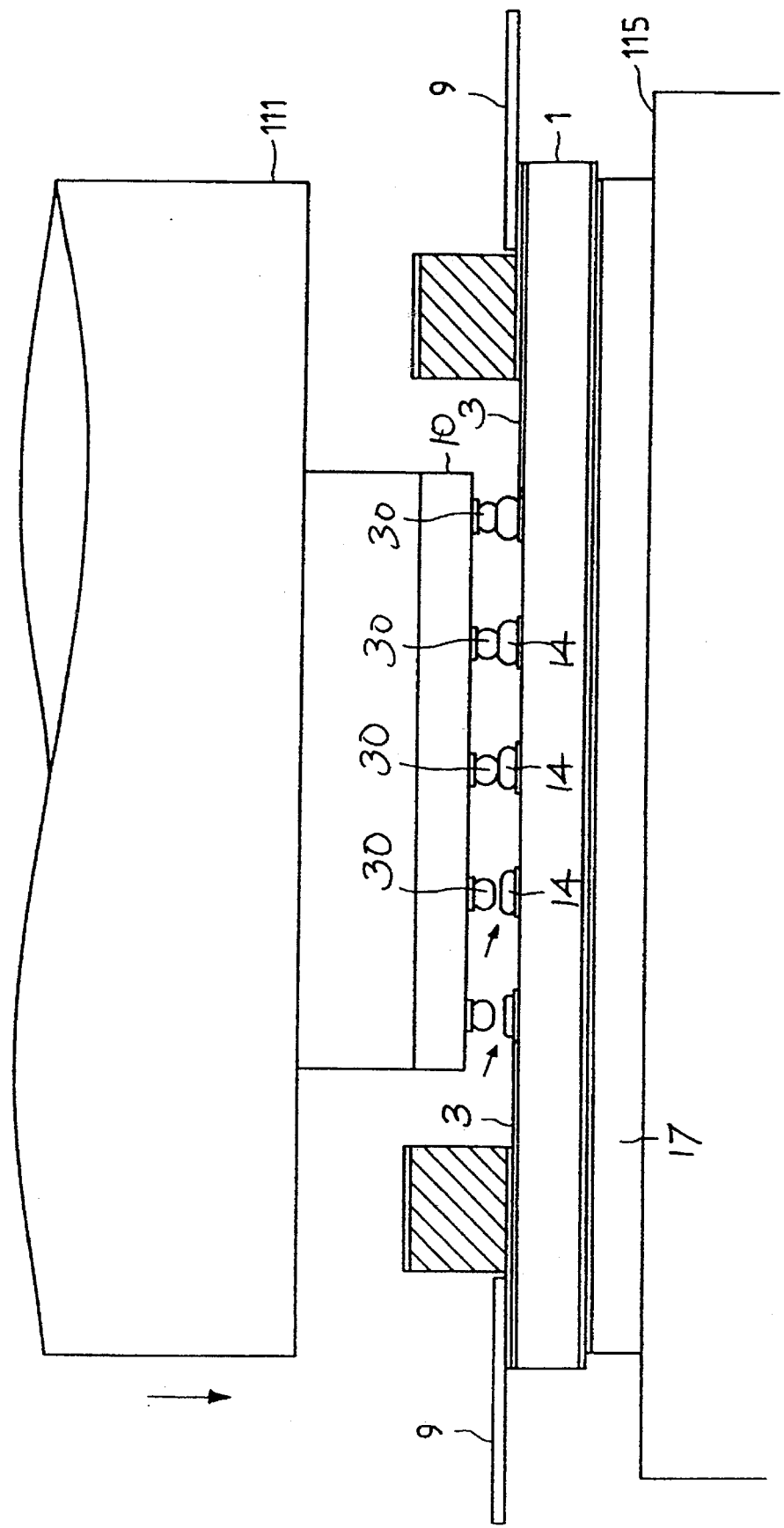
FIG. 31 is a schematic diagram showing the state in which joint failure is produced between metal balls of a semiconductor chip and metal lands of a wiring substrate.

Also the above-mentioned thermo compression bonding is carried out preferably using the stage 114 and the tool 110 (refer to FIG. 25) used when the Au ball 13 on the electrode 4 of the wiring substrate 1 is flattened. That is, when the Au balls 13 are flattened, the upper surface of the stage 114 must be in parallel to the bottom surface of the tool 110, but they are not completely in parallel because of limitation of the machining. Consequently, such a misalignment can cause uneven height Au lands, with an incline proportional to the relative inclination between the bottom surface of the tool 110 and the upper surface of the stage 114. Consequently, as shown in FIG. 31, if the thermo-compression bonding is carried out using a tool 111 and a stage 115 other than the tool 110 and the stage 114 as above described, since the relative inclination between the bottom surface of the tool 11 and the upper surface of the stage 115 is different from the relative inclination between the bottom surface of the tool 110 and the upper surface of the stage 114, when the Au ball 13 of the wiring substrate 1 and the Au ball 30 of the semiconductor chip 10 are overlaid each other, the tips of the Au balls 30 and the upper surface of the Au lands 14 do not become parallel. As a result, the thermo compression bonding of all Au balls 30 and all Au lands 14 cannot be carried out uniformly at the same load, and unsymmetrical partial floatation is produced between the Au balls 30 and Au lands 14.

Figure 32:
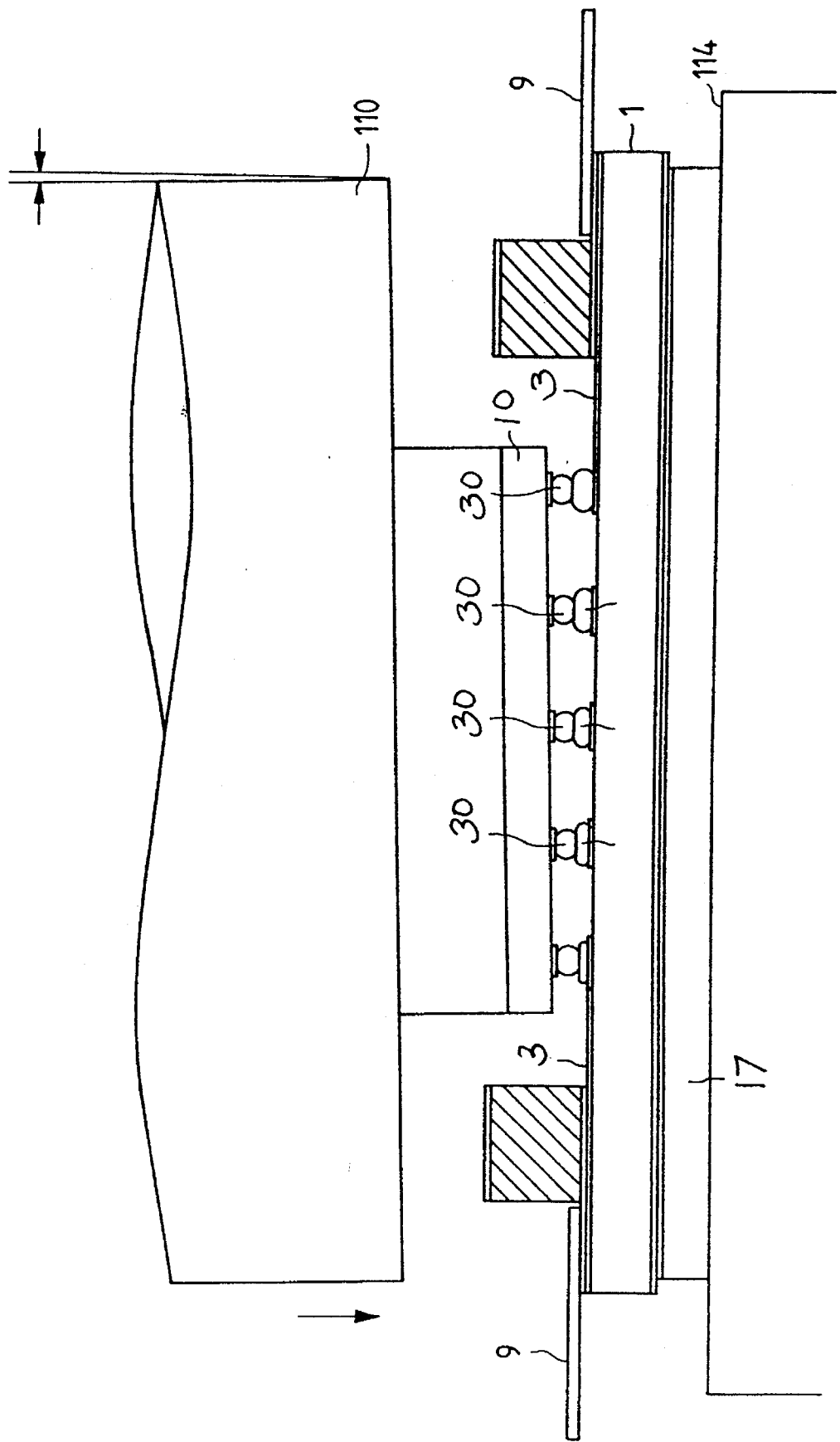
FIG. 32 is a schematic diagram showing a method of thermo-compression bonding of metal balls of a semiconductor chip and metal lands of a wiring substrate.

On the contrary, when thermo-compression bonding of the Au balls 30 and the Au lands 14 is carried out using the stage 114 and the tool 110 used in flattening the Au balls 13 of the wiring substrate 1, since the relative inclination between the upper surface of the stage 114 and the bottom surface of the tool 110 is not varied during flattening the Au balls 13 and during the thermo-compression bonding of the Au balls 30 and the Au lands 14, as shown in FIG. 32, the tips of the Au balls 30 of the semiconductor chip 10 held at the bottom surface of the tool 110 and the upper surface of the Au lands 14 of the wiring substrate 1 put on the stage 114 become completely parallel, and the thermo compression bonding of all balls 30 and all lands 14 can be carried out uniformly at the same load.

In order to prevent the joining failure between the Au balls 30 and the Au lands 14 caused by unsymmetrical floating as described above, for example, the flattening and the thermo-compression bonding are carried out in following manner.

Figure 33:
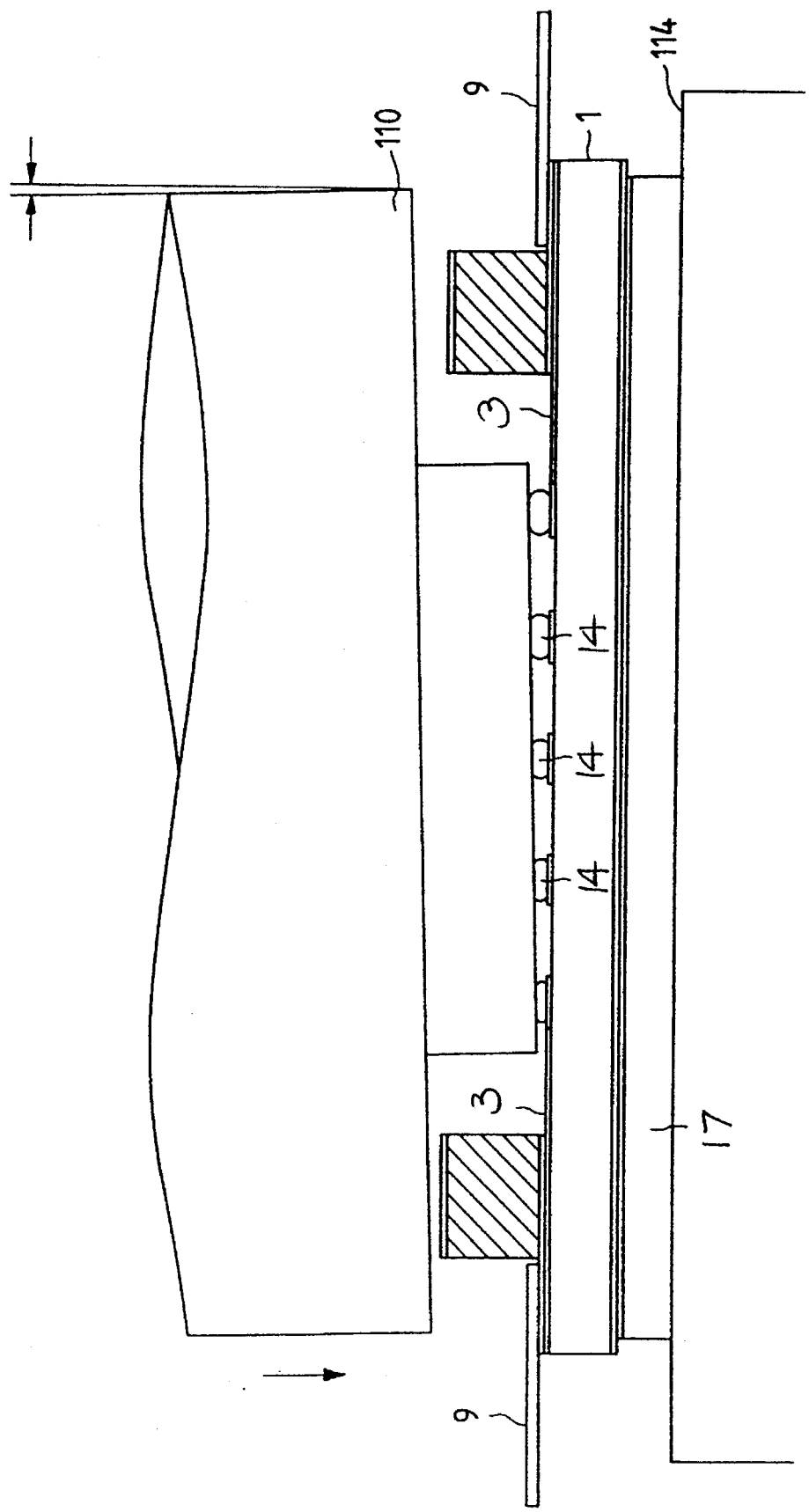
FIG. 33 is a schematic diagram showing an example of a method of flattening metal balls.
Figure 34:
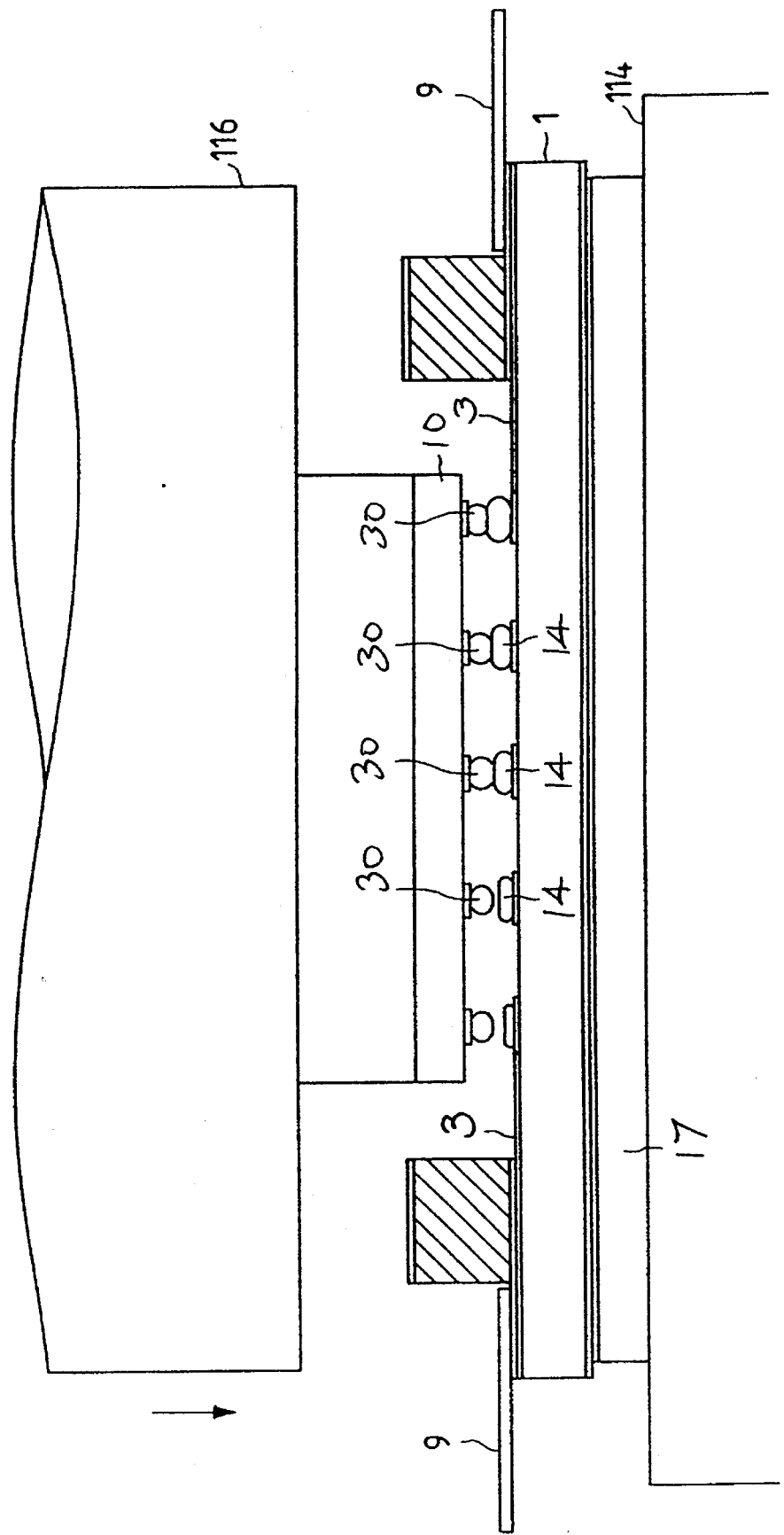
FIG. 34 is a schematic diagram showing an example of a method of thermo-compression bonding of metal balls of a semiconductor chip and metal lands of a wiring substrate.

First, as shown in FIG. 33, when the Au balls 13 and the Au lands 14 are bonded using the stage 114 and the tool 110, the Au lands 14 are formed with uneven height proportional to relative inclination between the bottom surface of the tool 110 and the upper surface of the tool 110. Next, as shown in FIG. 34, using a temporary fixing tool 116 other than the above-mentioned tool 110, the Au balls 30 of the semiconductor chip 10 and the Au land 14s of the wiring substrate 1 corresponding to the Au balls 30 are overlaid upon each other. Then the load applied to the rear surface of the semiconductor chip 10 is decreased and the joining between the Au balls 30 and the Au lands 14 is made incomplete. In this case, even if the joining between both is incomplete, since the anchors 32 provided at the Au ball 30 bites into the Au balls 30 weakly, positions of both are not deviated.

Figure 35:
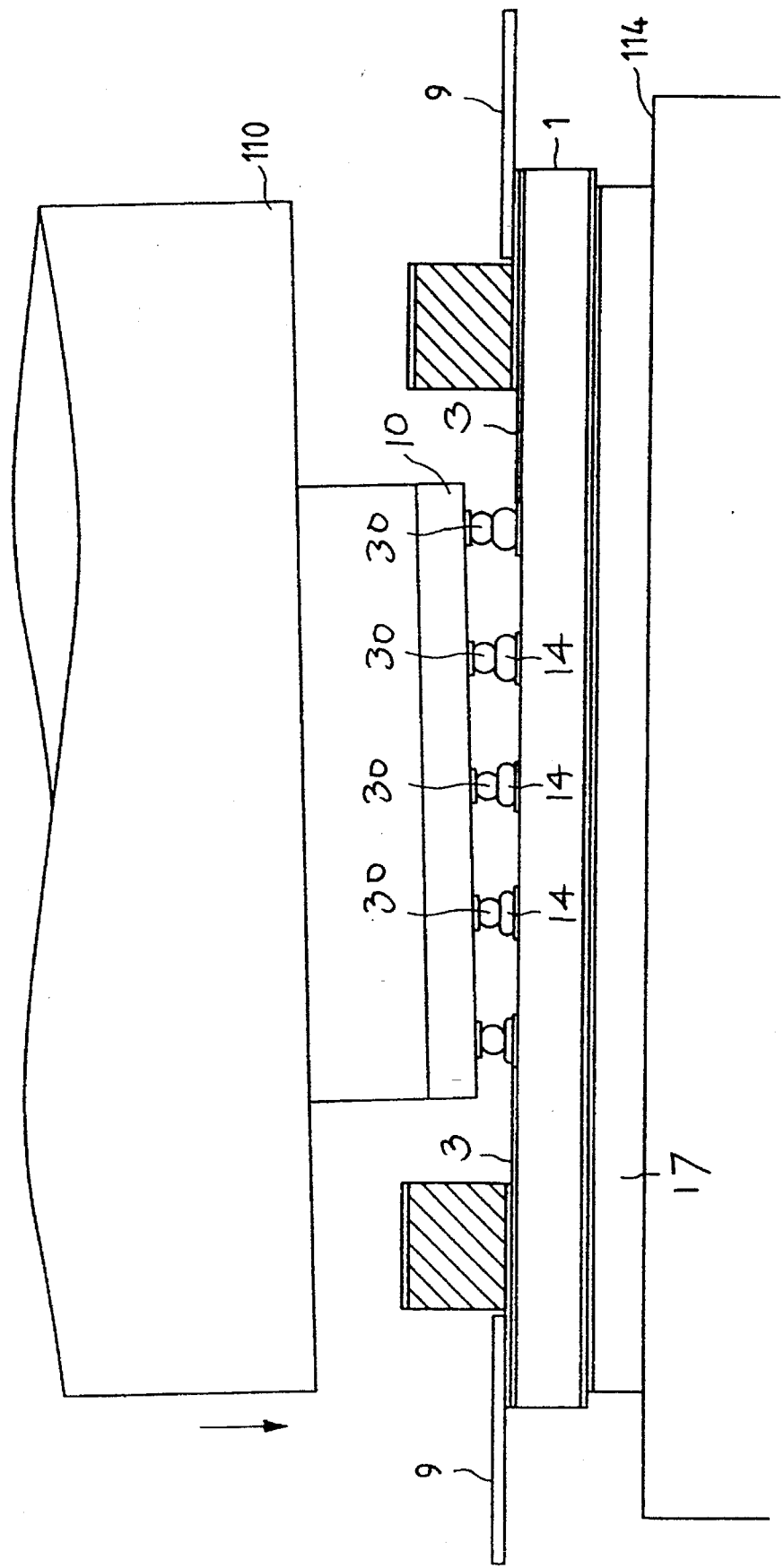
FIG. 35 is a schematic diagram showing an example of a method of thermo-compression bonding of metal balls of a semiconductor chip and metal lands of a wiring substrate.

Next, as shown in FIG. 35, when a large load is applied to the rear surface of the semiconductor chip 10 using again the tool 110 used in flattening the Au balls 13, the Au balls 30 and the Au lands 14 are completely joined. Then, since the relative inclination between the upper surface of the stage 114 and the bottom surface of the tool 110 is the same as that during flattening the Au balls 13, the tips of the Au balls 30 and the upper surfaces of the Au lands 14 become completely parallel and all Au balls 30 and all Au lands 14 can be joined at the uniform load. Also in this method, since the flattening and the thermo-compression bonding are carried out on the same stage 114, the wiring substrate 1 need not be transferred from the flattening process to the thermo compression bonding process. Consequently, the position deviation of the Au balls 30 liable to occur during transferring the wiring substrate 1 can be avoided.

Figure 36:
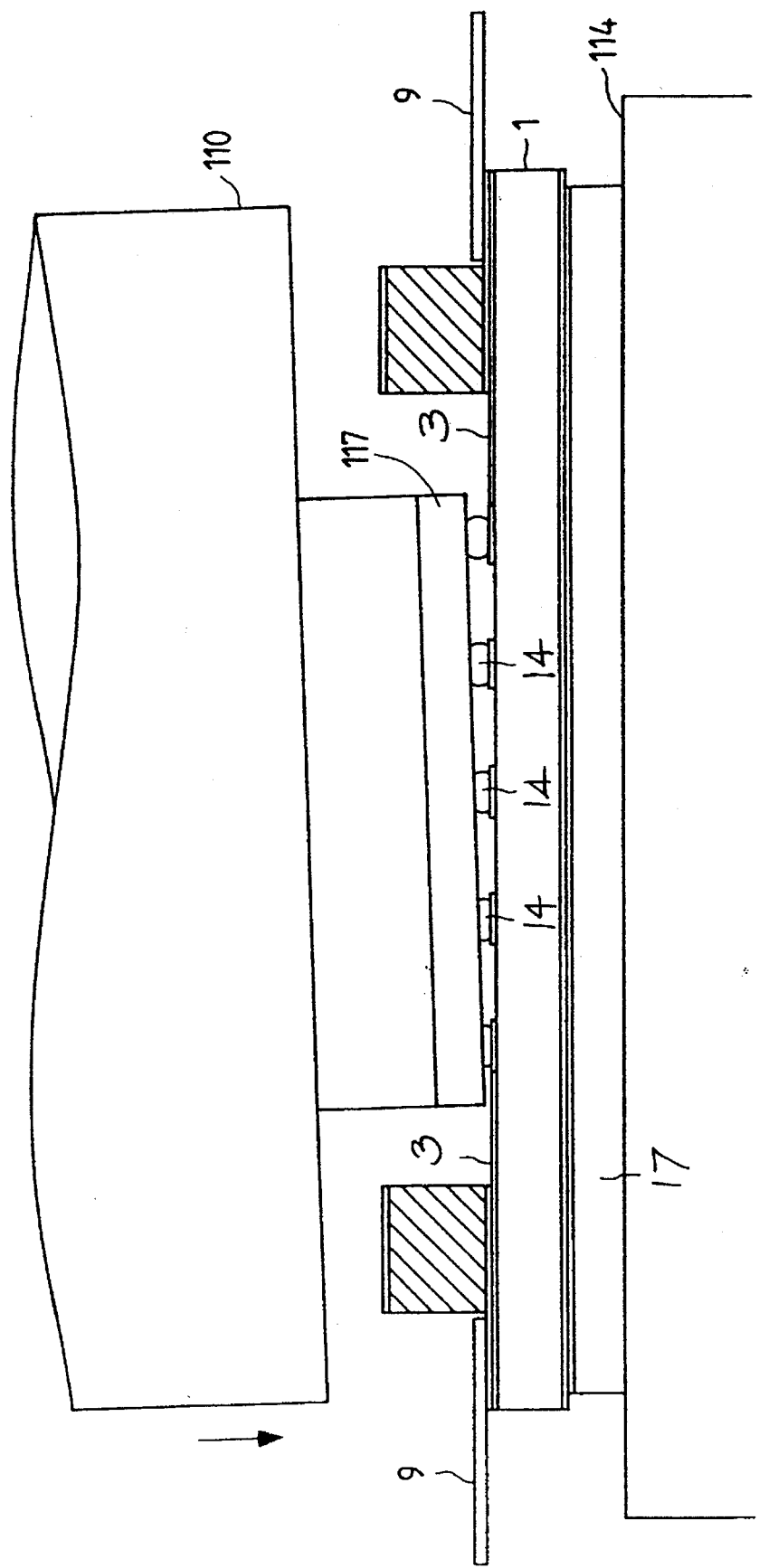
FIG. 36 is a schematic diagram showing another example of a flattening method of metal balls.
Figure 37:
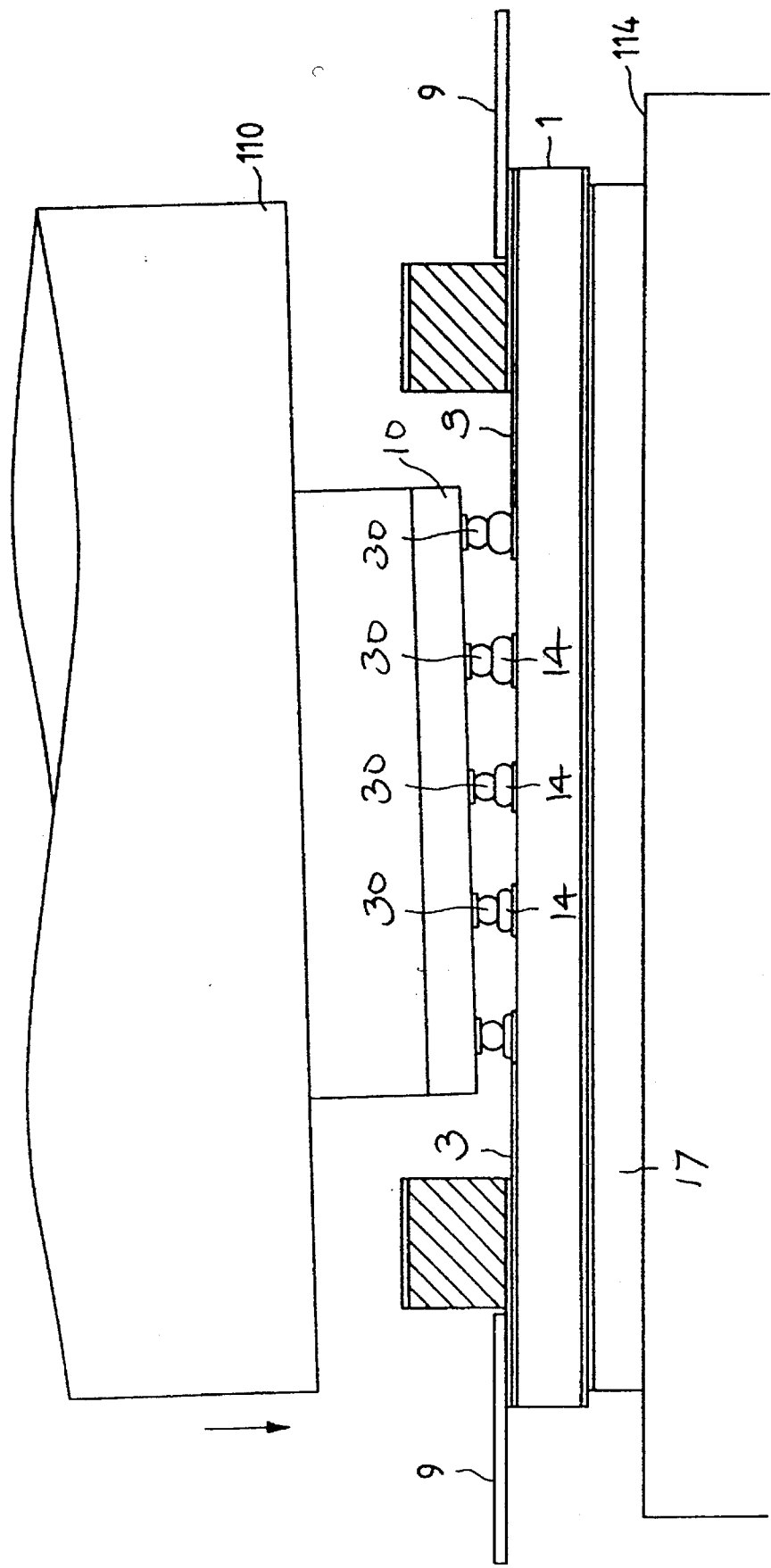
FIG. 37 is a schematic diagram showing another example of a method of thermo-compression bonding of metal balls of a semiconductor chip and metal lands of a wiring substrate.

The flattening of the Au balls 13 and thermo-compression bonding of the Au balls 30 to the Au lands 14 may be carried out also in following method. First, as shown in FIG. 36, a dummy chip 117 having the same flatness as that of a semiconductor chip 10 is attached to the bottom surface of a tool 110, and the bottom surface of the dummy chip 132 is bonded in compression bonding to an Au balls 13 of a wiring substrate 1 put on a stage 114 to form Au lands 14. Then, if a thin film of high hardness such as diamond is coated at the bottom surface of the dummy chip 117, breaking of the dummy chip 117 or abrasion of the bottom surface can be prevented. Next, as shown in FIG. 37, the dummy chip 117 is detached from the bottom surface of the tool 110 and the semiconductor chip 10 is attached, and the Au balls 30 of the semiconductor chip 10 and the Au land 14 of the wiring substrate 1 are overlaid and joined by thermo-compression bonding.

Also, according to the second method as above described, since the flattening and the thermo-compression bonding are carried out using the same stage 114 and the tool 110, all Au balls 30 and all Au lands 14 can be joined at the uniform load. Also, since the surface of the semiconductor chip 10 usually has the flatness much higher than that of the bottom surface of the tool 110, other chip having nearly the same flatness as that of the semiconductor chip 10, that is, the dummy chip 117 is bonded in compression bonding to the Au balls 13 and the Au lands 14 is formed, thereby dispersion of height of the Au land 14 caused by roughness of the bottom surface of the tool 110 is reduced to a negligible degree, and the Au balls 30 and the Au lands 14 can be overlaid and joined with high accuracy.

Figure 38:
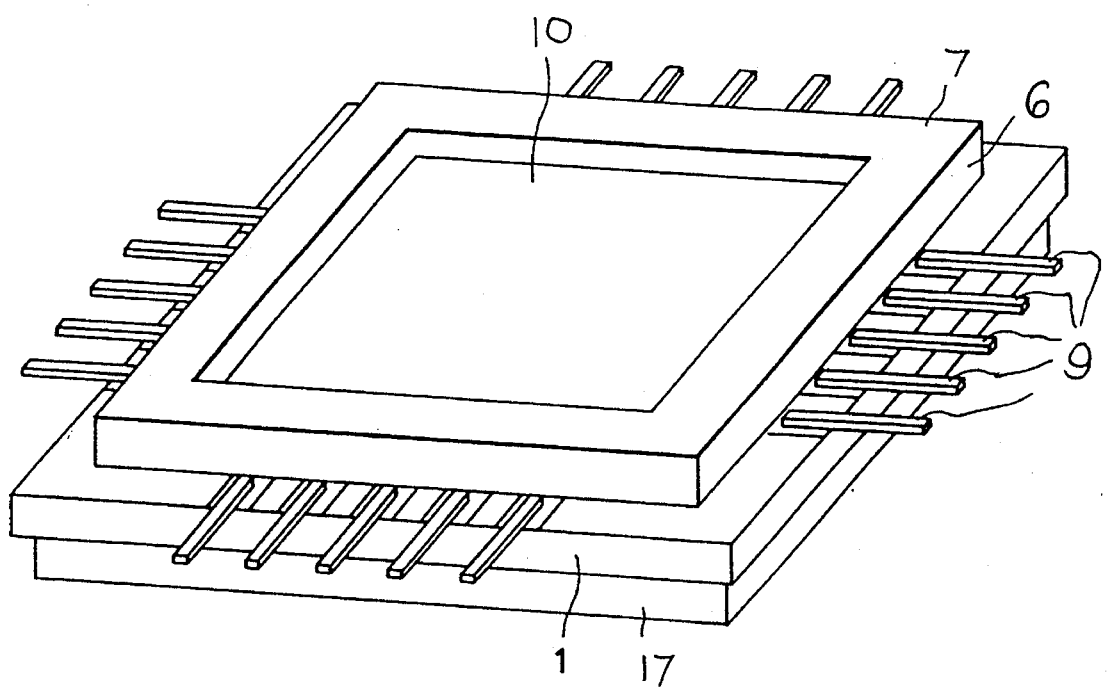
FIG. 38 is a perspective view of a wiring substrate with a semiconductor chip mounted thereto.
Figure 39:
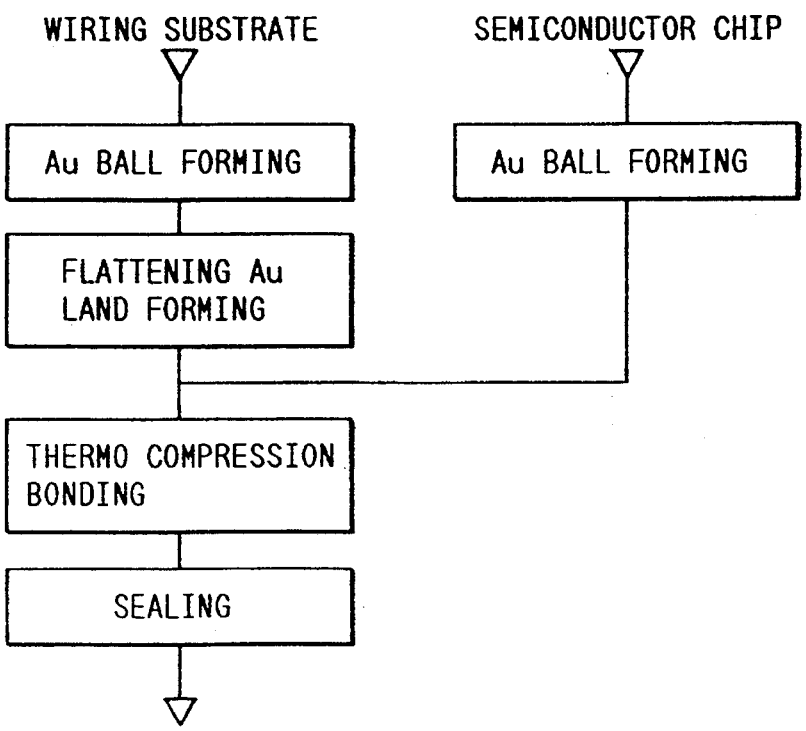
FIG. 39 is a flow chart showing manufacturing process of a semiconductor integrated circuit device according to another aspect of the present invention.

FIG. 38 shows a wiring substrate 1 on which a semiconductor chip 10 is mounted according to the above mentioned method. Then, then a cap 18 is joined to an upper surface of a dam frame 6 of the wiring substrate 1 as previously described. FIG. 39 is a flow chart of a manufacturing process described above.

Figure 40:
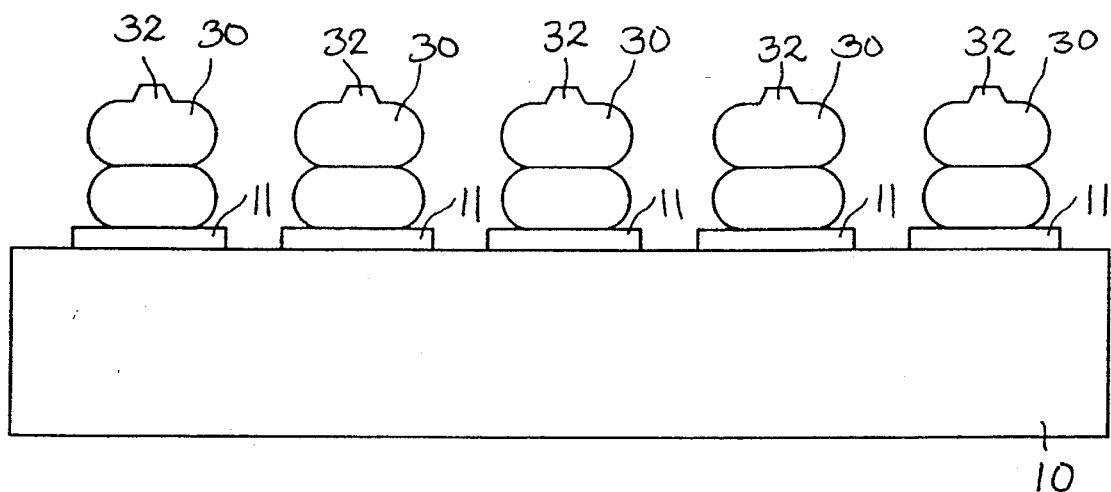
FIG. 40 is an enlarged view showing another example of metal balls formed on electrode pads of a semiconductor chip according to the present invention.

Referring to FIG. 40, in this embodiment, the Au balls 30 having anchors 32 are formed on an electrode pad 11 of a semiconductor chip 10, and then tips of the anchors 32 are flattened slightly to equalize the height thereof. Consequently, since height of not only the Au lands 14 of the wiring substrate 1 but also the Au balls 30 of the semiconductor chip 10 can be equalized. The Au balls 30 and the Au lands 14 can thus be overlaid and joined with high accuracy.

Figure 41:
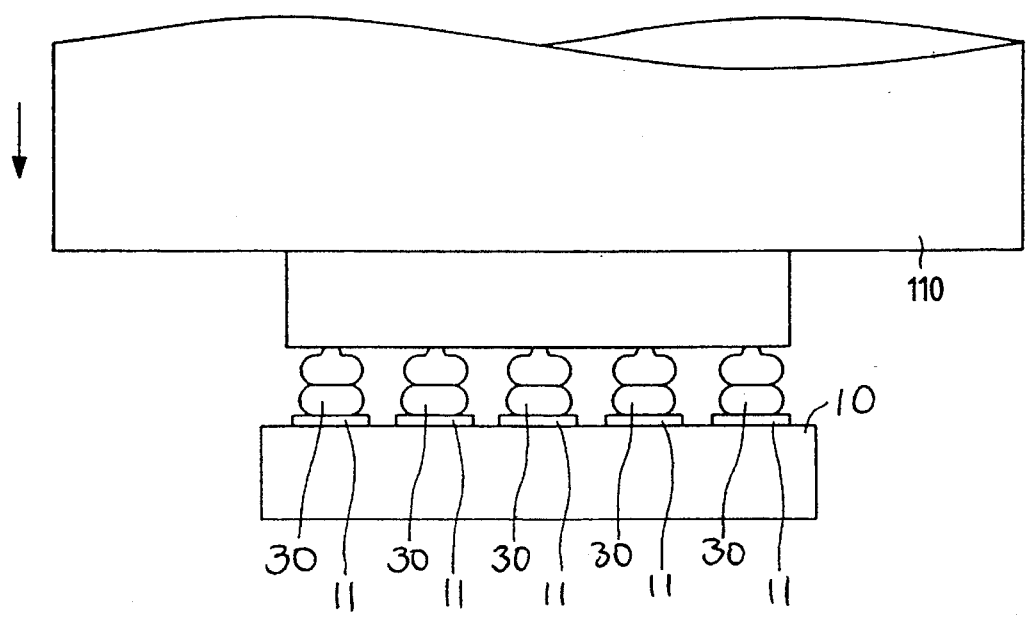
FIG. 41 is a schematic diagram showing a method of flattening tips of anchors of metal balls.
Figure 42:
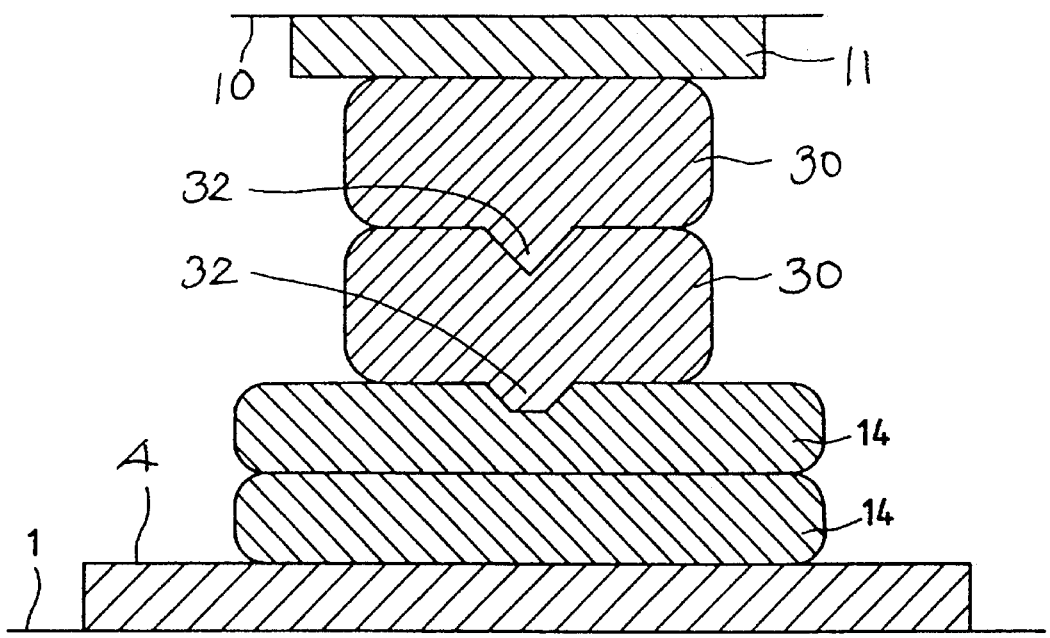
FIG. 42 is a sectional view showing the state in which the anchor of a metal ball is embedded into a metal land.
Figure 43:
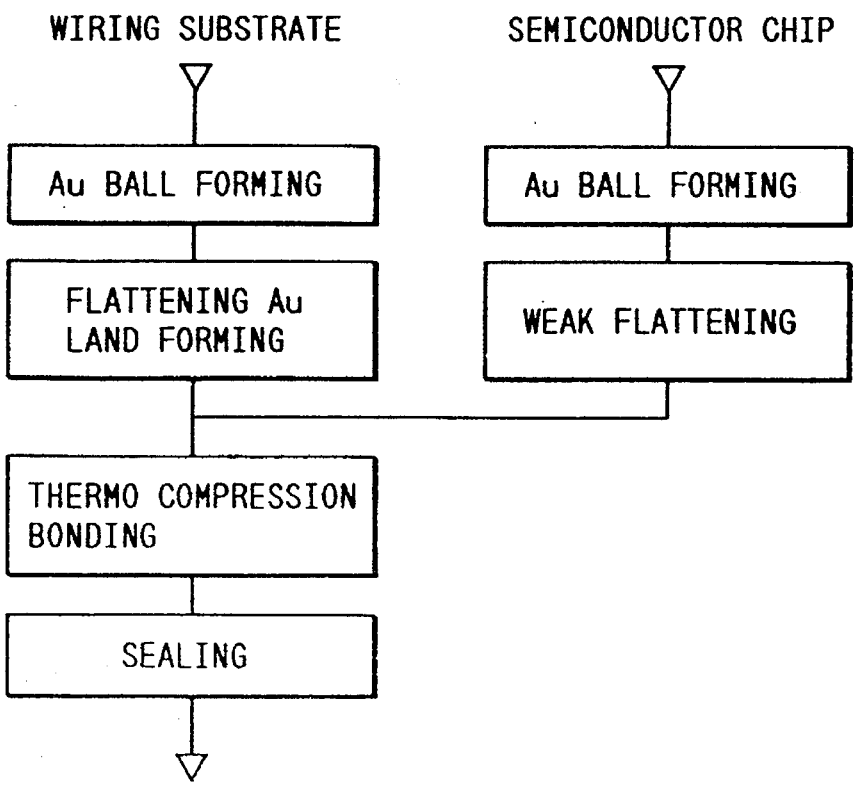
FIG. 43 is a flow chart showing manufacturing process of a semiconductor integrated circuit device according to another aspect of the present invention.

In order to flatten the tip of each anchor 32, after the Au balls 30 are formed on the electrode pads 11 of the semiconductor chip 10 by the above-mentioned ball bonding method, as shown in FIG. 41, a bottom surface of a tool 110 for flattening is weakly pressed to the Au balls 30, and the anchors 32 of all Au balls 30 are flattened together at the same time. Then the load is about 50 gf per one Au ball 30. Then, the Au balls 30 and the Au lands 14 are overlaid by the method described in the above-mentioned embodiment and joined by thermo-compression bonding. Then, as shown in FIG. 42, the anchors 32 of the Au balls 30 are embedded into the Au lands 14. FIG. 43 is a flow chart of the manufacturing process described above.

Figure 44:
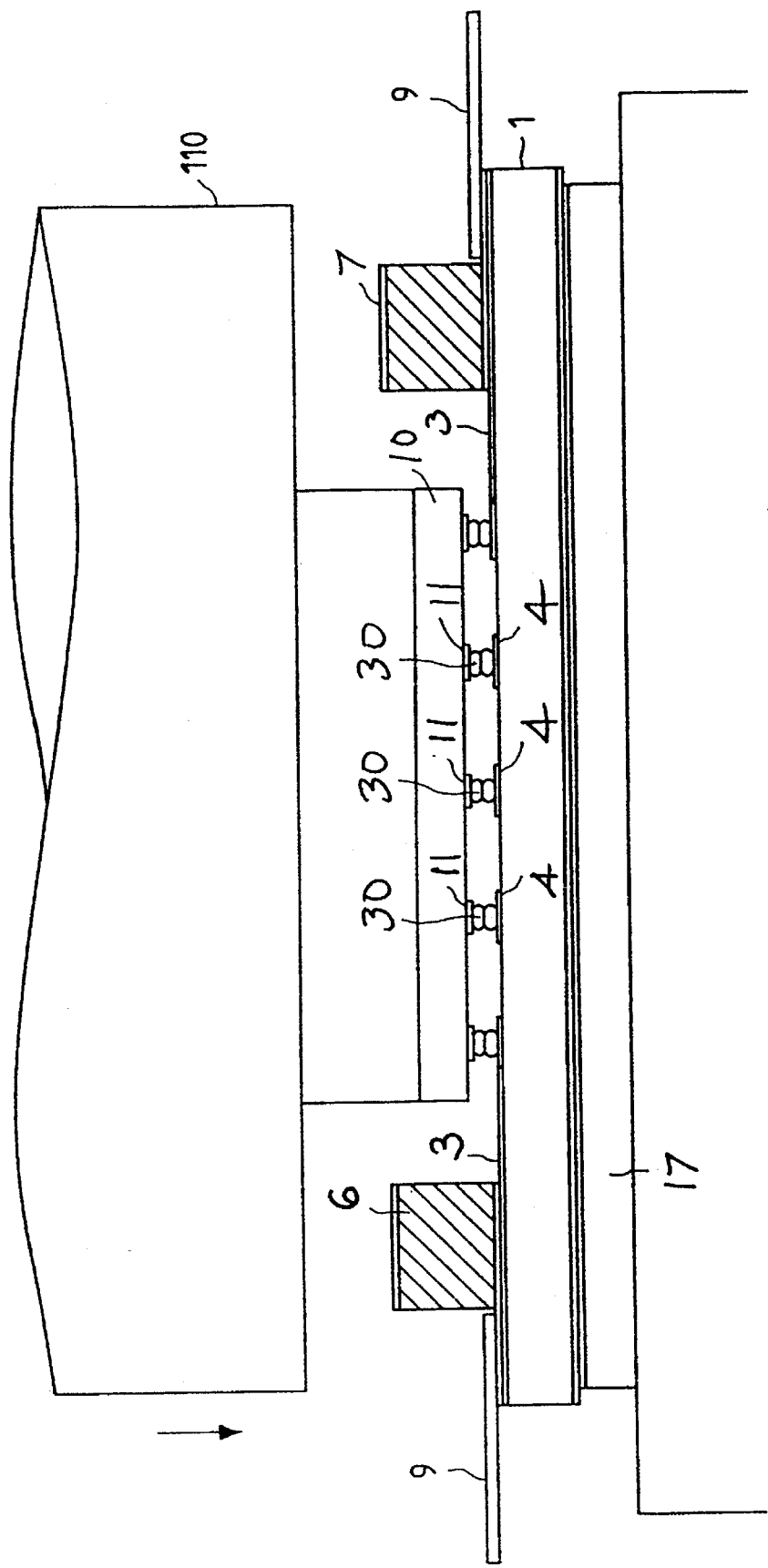
FIG. 44 is a schematic diagram showing a method of connecting metal balls of a semiconductor chip and electrodes of a wiring substrate according to another aspect of the present invention.
Figure 45:
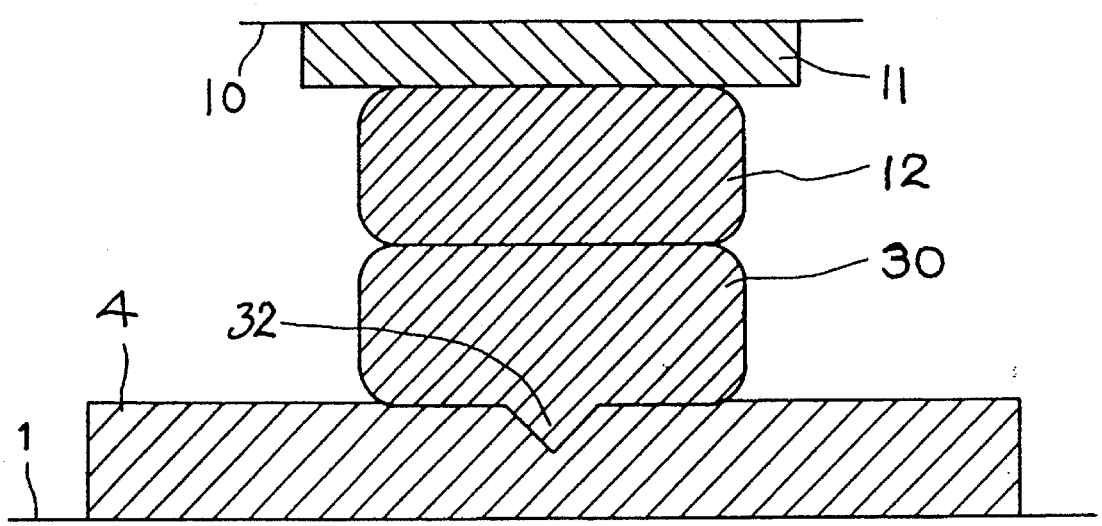
FIG. 45 is a sectional view showing the state in which the anchor of a metal ball is embedded into an electrode.

Referring to FIG. 44, in this embodiment, in place of the above-mentioned means for forming the Au lands 14 on the electrode 4 of the wiring substrate 1, electrode 4 is constituted by a conductive plastic film. In order to carry out the face down bonding of a semiconductor chip 10 to the wiring substrate 1, after Au balls 30 are formed on the electrode pads 11 of the semiconductor chip 10 as described previously, the Au-balls 30 and the electrodes 4 are overlaid and the load may be applied to the rear surface of the semiconductor chip 10. In this case, since the electrode 4 is constituted by plastics softer than the Au ball 30, as shown in FIG. 45, the anchors 32 of the Au balls 30 can be easily embedded into the electrode 4 to securely connect the Au balls 30 to the electrodes 4.

Thus, according to this embodiment, the wiring substrate 1 and the semiconductor chip 10 can be connected easily and securely. In addition, the electrode 4 of the wiring substrate 1 may be made of a soft material such as conductive rubber.

According to the present invention, although Au balls are joined onto the electrode pads of the semiconductor chip, any other metal having malleability and capable of being joined by thermo-compression bonding may be used.

In the above embodiments, the Au balls are bonded to electrode pads of a semiconductor chip by a ball bonding method using heat or ultrasonic energy or both. However, it is also possible to form the Au balls on the electrode pads by, for example, an electroless plating method.

The above embodiments described are the case in which a compound semiconductor chip made of, for example, GaAs and having a semiconductor integrated circuit operated on radio frequencies is mounted on a printed circuit board. However, the present invention can be also applied to a case in which a semiconductor chip with many pins or a semiconductor chip producing a large amount of heat is mounted on the printed circuit board.

Given the disclosure of the present invention, one versed in the art would readily appreciate the fact that there can be many other embodiments and modifications that are well within the scope and spirit of the disclosure set forth herein, but not specifically depicted and described. Accordingly, all expedient modifications readily attainable by one versed in the art from the disclosure set forth herein that are within the scope and spirit of the present invention are to be included as further embodiments of the present invention. The scope of the present invention accordingly is to be defined as set forth in the appended claims.

What is claimed is:

1. A method of fabricating a semiconductor integrated circuit device comprising the steps of:

providing a semiconductor chip having a main surface, an integrated circuit and a plurality of electrode pads formed on said main surface;

providing a substrate having a main surface, a plurality of wiring electrodes and a plurality of wirings formed on said main surface, one end of each of the wirings electrically connected to the respective wiring electrodes, said substrate having a plurality of leads, each of which is electrically connected to one of other ends of said wirings;

forming first gold balls on said electrode pads of said semiconductor chip by a thermo-compression ball-bonding method;

forming second gold balls on said wiring electrodes of said substrate by said thermo-compression ball-bonding method;

simultaneously flattening said second gold balls formed on said substrate by pressing said gold balls with a flat surface to form gold wiring lands; and bonding said first gold balls formed on said main surface of said chip to said wiring lands.

2. A method of fabricating a semiconductor integrated circuit device according to claim 1, wherein a square frame for surrounding said plurality of lands is formed on said substrate for providing a cavity in which said semiconductor chip is mounted.

3. A method of fabricating a semiconductor integrated circuit device according to claim 2, further comprising the step of:

sealing the semiconductor chip in the cavity by providing a quadrilateral sealing body on the frame.

4. A method of fabricating a semiconductor integrated circuit device according to claim 2, further comprising the step of:

bonding heat conductive means made of a metal to one surface of a quadrilateral sealing body, and sealing the semiconductor chip in the cavity by attaching the sealing body to the frame so that the heat conductive means contacts a back surface of the semiconductor chip facing the main surface of the semiconductor chip.

5. A method of fabricating a semiconductor integrated circuit device according to claim 4, wherein the heat conductive means are gold ribbons.

6. A method of fabricating a semiconductor integrated circuit device according to claim 4, wherein the heat conductive means are gold wires.

7. A method of fabricating a semiconductor integrated circuit device according to claim 4, wherein the heat conductive means are gold bumps.

8. A method of fabricating a semiconductor integrated circuit device according to claim 2, further comprising the step of:

bonding a plurality of heat conductive means of metallic bumps to one surface of a quadrilateral sealing body, and sealing the semiconductor chip in the cavity by attaching the sealing body to the frame so that the heat conductive means contacts a back surface of the semiconductor chip facing the main surface of the semiconductor chip.

9. A method of fabricating a semiconductor integrated circuit device according to claim 1, further comprising the steps of:

forming third gold balls on said first balls formed on said semiconductor chip by said thermo-compression ball-bonding method.

10. A method of fabricating a semiconductor integrated circuit device according to claim 1, wherein a metallic board is attached to a back surface of the substrate opposite the main surface.

11. A method of fabricating a semiconductor integrated circuit device according to claim 1, wherein at least one of said first gold balls has a sharp tipped anchor.

12. A method of fabricating a semiconductor integrated circuit device according to claim 11, further comprising the step of slightly flattening said anchors to equalize the height of the first gold balls prior to bonding said first gold balls to said second gold balls.

13. A method of fabricating a semiconductor integrated circuit device according to claim 11, further comprising the step of heating said first gold balls and said second gold balls during said bonding step.

14. A method of fabricating a semiconductor integrated circuit device according to claim 1, wherein said substrate includes a plurality of leads, each of said leads being electrically connected to one of other ends of said wirings.

15. A method of fabricating a semiconductor integrated circuit device comprising the steps of:

providing a semiconductor chip having a main surface, an integrated circuit and a plurality of electrode pads formed on said main surface;

providing a substrate having a main surface, a plurality of wiring electrodes and a plurality of wirings formed on said main surface, one end of each of the wirings electrically connected to the respective wiring electrodes;

forming first metal balls on said electrode pads of said semiconductor chip by a thermo-compression ball-bonding method, wherein said first metal balls each have an anchor;

forming second metal balls on said wiring electrodes of said substrate by said thermo-compression ball-bonding method;

simultaneously flattening said second metal balls formed on said substrate by pressing said second metal balls with a flat surface to equalize the height of said second metal balls, said flattened second balls forming wiring lands; and bonding said first metal balls to said wiring lands by embedding the anchors of said first metal balls into said wiring lands.

16. A method of fabricating a semiconductor integrated circuit device according to claim 15, further comprising the step of slightly flattening said anchors to equalize the height of the first metal balls prior to bonding said first metal balls to said second metal balls.

17. A method of fabricating a semiconductor integrated circuit device according to claim 15, further comprising the step of heating said first metal balls and said second metal balls during said bonding step.

18. A method of fabricating a semiconductor integrated circuit device according to claim 15, wherein said first metal balls are heated and softened at a temperature lower than the recrystallization temperature thereof during said bonding step.

19. A method of fabricating a semiconductor integrated circuit device according to claim 1, wherein said second metal balls are heated and softened at a temperature higher than the recrystallization temperature thereof during said bonding step.

20. A method of fabricating a semiconductor integrated circuit device comprising the steps of:

providing a semiconductor chip having a main surface, an integrated circuit and a plurality of electrode pads formed on said main surface;

providing a substrate having a main surface, a plurality of wiring electrodes and a plurality of wirings formed on said substrate main surface, one end of each of the wirings electrically connected to the respective wiring electrodes;

forming first metal balls on said electrode pads of said semiconductor chip by a thermo-compression ball-bonding method, wherein said first metal balls each have an anchor;

forming second metal balls on said wiring electrodes of said substrate by a thermo-compression ball bonding method; and bonding said first metal balls to said second metal balls by embedding the anchors of said first metal balls into said second metal balls.

21. A method of fabricating a semiconductor integrated circuit device comprising the steps of:

providing a semiconductor chip having a main surface, an integrated circuit and a plurality of electrode pads formed on said main surface;

providing a substrate having a main surface, a plurality of wiring electrodes and a plurality of wirings formed on said main surface, one end of each of the wirings electrically connected to the respective wiring electrodes;

forming first gold balls on said electrode pads of said semiconductor chip by a thermo-compression ball-bonding method;

forming second gold balls on said wiring electrodes of said substrate by said thermo-compression ball-bonding method;

simultaneously flattening said second gold balls formed on said substrate by pressing said gold balls with a flat surface to form gold wiring lands; and bonding said first gold balls formed on said main surface of said chip to said wiring lands.

* * * * *